United States Patent [19]
Takahashi

[11] Patent Number: 6,114,872
[45] Date of Patent: Sep. 5, 2000

[54] DIFFERENTIAL INPUT CIRCUIT

[75] Inventor: Yasuhiko Takahashi, Tokyo, Japan

[73] Assignee: Nippon Steel Corporation, Tokyo, Japan

[21] Appl. No.: 09/120,284

[22] Filed: Jul. 22, 1998

Related U.S. Application Data

[63] Continuation-in-part of application No. 08/864,917, May 29, 1997, abandoned.

[30] Foreign Application Priority Data

| May 31, 1996 | [JP] | Japan | ................................ 8-161054 |
| Jul. 22, 1997 | [JP] | Japan | ................................ 9-211348 |

[51] Int. Cl.$^7$ .................................................. H03K 17/16
[52] U.S. Cl. ............................... 326/23; 326/17; 326/34; 326/83; 326/121
[58] Field of Search ................................ 326/17, 31, 34, 326/83, 86, 115, 119, 121; 327/375, 325

[56] References Cited

U.S. PATENT DOCUMENTS

| 4,608,503 | 8/1986 | Wong et al. | ............................. 326/86 |
| 4,945,262 | 7/1990 | Piasecki | ................................ 326/83 |
| 5,534,789 | 7/1996 | Ting | ........................................ 326/83 |
| 5,677,642 | 10/1997 | Rehm et al. | ............................. 327/65 |
| 5,850,158 | 12/1998 | Kattamann | ............................. 327/375 |

OTHER PUBLICATIONS

Itoh, Super LSI Memory, Baifukan Co., Ltd., pp. 64–69, 1994.

*Primary Examiner*—Michael Tokar
*Assistant Examiner*—Don Phu Le
*Attorney, Agent, or Firm*—Pollock, Vande Sande & Amernick, R.L.L.P.

[57] ABSTRACT

A differential input circuit includes a first differential circuit of a current mirror type for generating a first differential voltage by using an input voltage and a reference voltage, a second differential circuit of a current mirror type for generating a second differential voltage having a phase opposite to that of the first differential voltage by using the input voltage and the reference voltage, and a third differential circuit for generating an output voltage corresponding to a difference voltage of the first and second differential voltages by using the first and second differential voltages. A first clamping circuit for clamping the first differential voltage is provided between the first and third differential circuits. A second clamping circuit for clamping the second differential voltage is provided between the second and third differential circuits.

23 Claims, 16 Drawing Sheets

TIME [ns]

DIFFERENTIAL INPUT CIRCUIT

This is a continuation-in-part of U.S. application Ser. No. 08/864,917 filed May 29, 1997 now abandoned, the whole contents of which are incorporated herein by reference.

BACKGROUND OF THE INVENTION

1. Field of the Invention

The invention relates to a differential input circuit and, more particularly, to a differential input circuit which is suitable for use in an interface portion such as SSTL-3 (Stub Series Terminated Logic for 3.3V) that is used in an IC circuit.

2. Description of the Related Art

In recent years, a performance of a CPU which is used in a computer or the like has remarkably been improved, and a CPU which operates at a high frequency of 100 MHz or higher is also provided. To raise an operating frequency of the CPU, an amplitude of a signal voltage is so small to be, for example, about 0.4V. In an IC circuit which needs an operating voltage of about 3V, therefore, it is necessary that an input voltage of a small amplitude which is supplied from the CPU through a system bus or the like needs to be amplified to a predetermined level. A differential input circuit is used to amplify the input voltage.

As shown in FIG. 1, a conventional differential input circuit includes two NMOS transistors N11 and N12 having the same characteristics and two PMOS transistors P11 and P12 having the same characteristics (Refer to Itoh, "Super LSI memory", Baifukan Co., Ltd., p. 67, 1994). An input voltage Vin of a small amplitude is inputted to a gate of the NMOS transistor N11. A reference voltage Vref is inputted to a gate of the NMOS transistor N12. Sources of the two NMOS transistors N11 and N12 are connected to the ground. A drain of the NMOS transistor N11 is connected to a drain of the PMOS transistor P11. A drain of the NMOS transistor N12 is connected to a drain of the PMOS transistor P12. Gates of the two PMOS transistors P11 and P12 are mutually connected and are also connected to the drain of the NMOS transistor N11 and the drain of the PMOS transistor P11. A power voltage Vdd is supplied to sources of the two PMOS transistors P11 and P12. An output voltage Vout is derived from the drain of the NMOS transistor N12.

The differential input circuit is a circuit to which a general differential amplifying circuit of a current mirror type is applied and the output voltage Vout is obtained by amplifying a difference voltage between the input voltage Vin and reference voltage Vref. For example, as shown in FIG. 2, when the reference voltage Vref is set to a fixed voltage of 1.2V and the input voltage Vin is a pulse-like voltage which fluctuates at an amplitude of ±0.4V for a DC voltage of 1.2V, since the reference voltage Vref is the fixed voltage, an amplitude of the output voltage Vout is determined by a gain of the input voltage Vin. That is, the output voltage Vout that is proportional to the input voltage Vin is derived from the differential input circuit.

In a general differential amplifying circuit, both of the sources of the two NMOS transistors N11 and N12 are connected to the ground through a transistor, a constant current source, or the like. However, as shown in FIG. 2, when one of the two input voltages is a fixed voltage, there is a case where when the sources of the two NMOS transistors N11 and N12 are connected to the ground through the transistor, constant current source, or the like, the differential amplifying circuit does not operate normally. In the differential input circuit shown in FIG. 1, therefore, both of the sources of the two NMOS transistors N11 and N12 are directly connected to the ground.

In a present situation in which the operating speed of the CPU is high as mentioned above, since it is also necessary to improve a response speed of the IC circuit in association with it, it is necessary that the level of the output voltage which is obtained by the differential input circuit reaches about 3V as a necessary voltage level of the IC circuit as soon as possible.

In the differential input circuit of FIG. 1, however, as shown in FIG. 2, a leading slope of the output voltage Vout is gentle and it takes a too long time until the output voltage reaches about 3V as a necessary voltage level of the IC circuit.

As an example of a construction of a differential input circuit in which a leading time of the output voltage is short, as shown in FIG. 3, there is a circuit of a push-pull type of two stages using three differential input circuits shown in FIG. 1 (refer to Itoh, "Super LSI Memory", Baifukan Co., Ltd., p. 68, 1994). For convenience of explanation, the differential input circuit shown in FIG. 1 is called a "differential circuit" hereinafter.

The differential input circuit includes: a first differential circuit 1; a second differential circuit 2; a third differential circuit 3; an NMOS transistor N4 provided between the first and second differential circuits 1 and 2 and the ground; and an NMOS transistor N5 provided between the third differential circuit 3 and the ground. A drain of the NMOS transistor N4 is connected to the sources of the two NMOS transistors N11 and N12 of the first differential circuit 1 and sources of two NMOS transistors N21 and N22 of the second differential circuit 2. A source of the NMOS transistor N4 is connected to the ground. The power voltage Vdd is inputted to a gate of the NMOS transistor N4. A drain of the NMOS transistor N5 is connected to sources of two NMOS transistors N31 and N32 of the third differential circuit 3. A source of the NMOS transistor N5 is connected to the ground. The power voltage Vdd is inputted to a gate of the NMOS transistor N5.

In the differential input circuit, the input voltage Vin is inputted to the gate of the NMOS transistor N11 of the first differential circuit 1. The reference voltage Vref is inputted to a gate of the NMOS transistor N21 of the second differential circuit 2 corresponding to the NMOS transistor N11 of the first differential circuit 1. The reference voltage Vref is inputted to the gate of the NMOS transistor N12 of the first differential circuit 1. The input voltage Vin is inputted to a gate of the NMOS transistor N22 of the second differential circuit 2 corresponding to the NMOS transistor N12 of the first differential circuit 1. That is, the first and second differential circuits 1 and 2 are symmetrically connected with respect to the input voltage Vin and reference voltage Vref. Therefore, a first differential voltage V1 which is outputted from the drain of the NMOS transistor N12 of the first differential circuit 1 and a second differential voltage V2 which is outputted from a drain of the NMOS transistor N22 of the second differential circuit 2 have opposite phases.

The first differential voltage V1 is inputted to a gate of the NMOS transistor N32 of the third differential circuit 3. The second differential voltage V2 is inputted to a gate of the NMOS transistor N31 of the third differential circuit 3. Thus, the output voltage Vout which is proportional to the difference voltage between the first and second differential voltages V1 and V2 is derived (refer to FIG. 4).

Since both the first and second differential voltages V1 and V2 which are inputted to the third differential circuit 3 are not fixed voltages, the sources of the two NMOS transistors N31 and N32 can be connected to the ground through a transistor, a constant current source, or the like in a manner similar to an ordinary differential amplifying circuit. In the differential input circuit, the sources of the two NMOS transistors N31 and N32 are connected to the ground through the NMOS transistor N5. In the differential input circuit, since the sources of the two NMOS transistors N11 and N12 of the first differential circuit 1 and the sources of the two NMOS transistors N21 and N22 of the second differential circuit 2 can be also connected to the ground through a transistor, a constant current source, or the like, they are connected to the ground through the NMOS transistor N4.

However, in the differential input circuit shown in FIG. 3, as compared with the differential input circuit shown in FIG. 1, a leading slope of the output voltage Vout can be made slightly sharp. However, an improvement of the leading slope of the output voltage Vout is insufficient. That is, when levels of the first and second differential voltages V1 and V2 are changed in association with a trailing edge of the input voltage Vin shown in a time interval from a time of 0.25 nsec to a time of 26 nsec in FIG. 4, since a trailing slope of the first differential voltage V1 is gentle, a leading time of the output voltage Vout is long. With regard to the improvement of the tailing time of the output voltage Vout as well, it is insufficient because of a similar reason.

SUMMARY OF THE INVENTION

It is an object of the invention to provide a differential input circuit which can shorten a leading time or a trailing time of an output voltage when amplifying an input voltage of a small amplitude.

According to the invention, there is provided a first differential input circuit which comprises:

a first differential circuit of a current mirror type for generating a first differential voltage by using an input voltage and a reference voltage;

a second differential circuit of a current mirror type for generating a second differential voltage having a phase opposite to that of the first differential voltage by using the input voltage and the reference voltage;

a third differential circuit for generating an output voltage corresponding to a difference voltage between the first and second differential voltages by using the first and second differential voltages;

a first clamping circuit, provided between the first and third differential circuits, for clamping the first differential voltage; and a second clamping circuit, provided between the second and third differential circuits, for clamping the second differential voltage.

According to the invention, there is provided a second differential input circuit which comprises:

a first differential circuit of a current mirror type for generating a differential voltage by using an input voltage and a reference voltage;

an inverter circuit for generating a voltage having a phase opposite to that of the differential voltage by using the differential voltage;

a second differential circuit for generating an output voltage corresponding to a differential voltage between the differential voltage and the voltage by using the differential voltage and the voltage;

a first clamping circuit, provided between the first and second differential circuits, for clamping the differential voltage; and a second clamping circuit, provided between the inverter circuit and the second differential circuit, for clamping the voltage.

DETAILED DESCRIPTION OF THE PREFERRED EMBODIMENTS (First embodiment)

Figure 3:
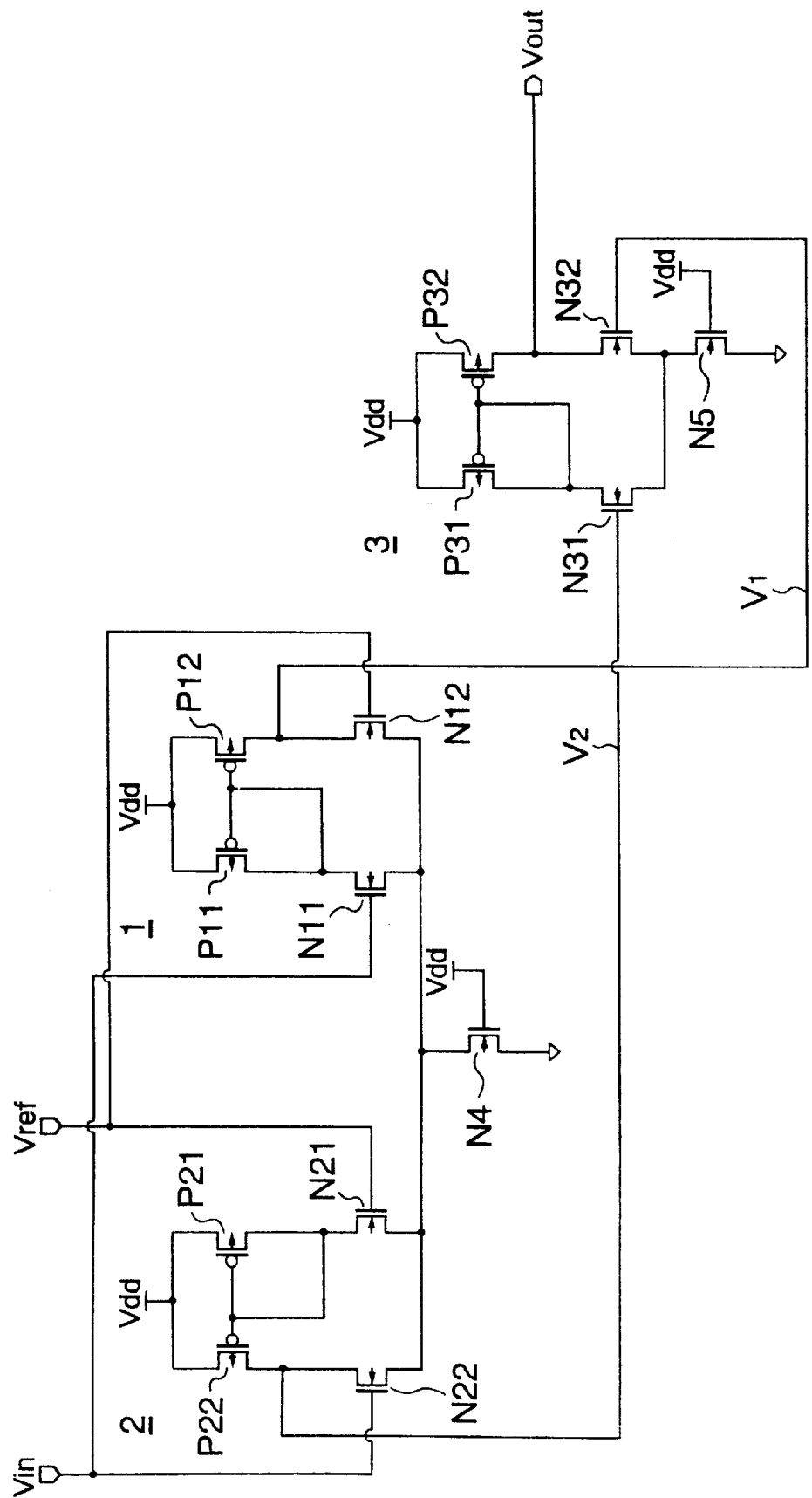
FIG. 3 is a circuit diagram showing another example of a construction of a conventional differential input circuit.
Figure 5:
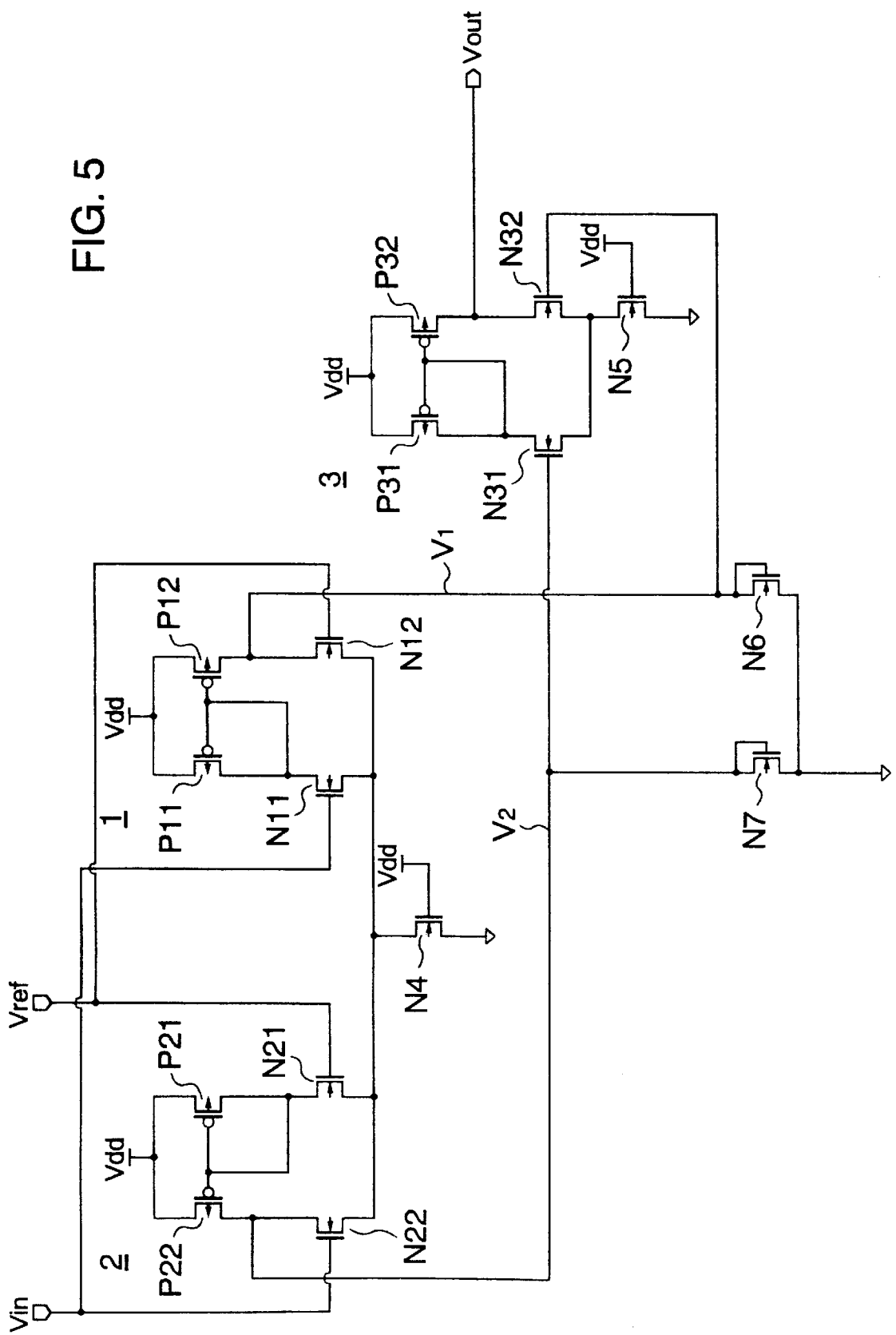
FIG. 5 is a circuit diagram showing a construction of a differential input circuit according to the first embodiment of the invention.

A differential input circuit according to the first embodiment of the invention differs from the conventional differential input circuit shown in FIG. 3 in that, as illustrated in FIG. 5, there are included: an NMOS transistor N6 which is provided between the first differential circuit 1 and third differential circuit 3 and functions as a first clamping circuit for preventing the first differential voltage V1 that is outputted from the first differential circuit 1 from being larger than a first threshold value Vth1; and an NMOS transistor N7 which is provided between the second differential circuit 2 and third differential circuit 3 and functions as a second clamping circuit for preventing the second differential voltage V2 that is outputted from the second differential circuit 2 from being larger than a second threshold value Vth2.

That is, in the differential input circuit according to the embodiment, the first differential circuit 1 of the current mirror type includes: the NMOS transistor N11 in which the input voltage Vin is inputted to the gate; the NMOS transistor N12 in which the reference voltage Vref is inputted to the gate; and the two PMOS transistors P11 and P12 whose gates are mutually connected. The sources of the two PMOS transistors P11 and P12 are mutually connected and the power voltage Vdd is inputted. The drain of the PMOS transistor P11 is connected to the gate of the PMOS transistor P11 and the drain of the NMOS transistor N11. The drain of the PMOS transistor P12 is connected to the drain of the NMOS transistor N12.

The second differential circuit 2 of the current mirror type includes: the NMOS transistor N21 in which the reference voltage Vref is inputted to the gate; the NMOS transistor N22 in which the input voltage Vin is inputted to the gate; and two PMOS transistors P21 and P22 whose gates are mutually connected. Sources of the two PMOS transistors P21 and P22 are mutually connected and the power voltage Vdd is inputted to them. A drain of the PMOS transistor P21 is connected to the gate of the PMOS transistor P21 and a drain of the NMOS transistor N21. A drain of the PMOS transistor P22 is connected to the drain of the NMOS transistor N22.

The sources of the two NMOS transistors N11 and N12 of the first differential circuit 1 and the sources of the two NMOS transistors N21 and N22 of the second differential circuit 2 are connected to the drain of the NMOS transistor N4 and are connected to the ground through the NMOS transistor N4. The power voltage Vdd is inputted to the gate of the NMOS transistor N4. The source of the NMOS transistor N4 is connected to the ground.

The first differential voltage V1 which is outputted from the drain of the NMOS transistor N12 of the first differential circuit 1 and the second differential voltage V2 which is outputted from the drain of the NMOS transistor N22 of the second differential circuit 2 have opposite phases.

The third differential circuit 3 includes: the NMOS transistor N31 in which the first differential voltage V1 is inputted to the gate; the NMOS transistor N32 in which the second differential voltage V2 is inputted to the gate; and two PMOS transistors P31 and P32 whose gates are mutually connected. Sources of the two PMOS transistors P31 and P32 are mutually connected and the power voltage Vdd is inputted to them. A drain of the PMOS transistor P31 is connected to a gate of the PMOS transistor P31 and a drain of the NMOS transistor N31. A drain of the PMOS transistor P32 is connected to a drain of the NMOS transistor N32.

The sources of the two NMOS transistors N31 and N32 of the third differential circuit 3 are connected to the drain of the NMOS transistor N5 and connected to the ground through the NMOS transistor N5.

The power voltage Vdd is inputted to the gate of the NMOS transistor N5. The source of the NMOS transistor N5 is connected to the ground.

The output voltage Vout is outputted from the drain of the NMOS transistor N32 of the third differential circuit 3.

A drain of the NMOS transistor N6 functioning as a clamping circuit is connected to the drain of the NMOS transistor N12 of the first differential circuit 1. A gate of the NMOS transistor N6 is connected to the drain of the NMOS transistor N6. A source of the NMOS transistor N6 is connected to the ground. Similarly, a drain of the NMOS transistor N7 functioning as a clamping circuit is connected to the drain of the NMOS transistor N22 of the second differential circuit 2. A gate of the NMOS transistor N7 is connected to the drain of the NMOS transistor N7. A source of the NMOS transistor N7 is connected to the ground.

Figure 4:
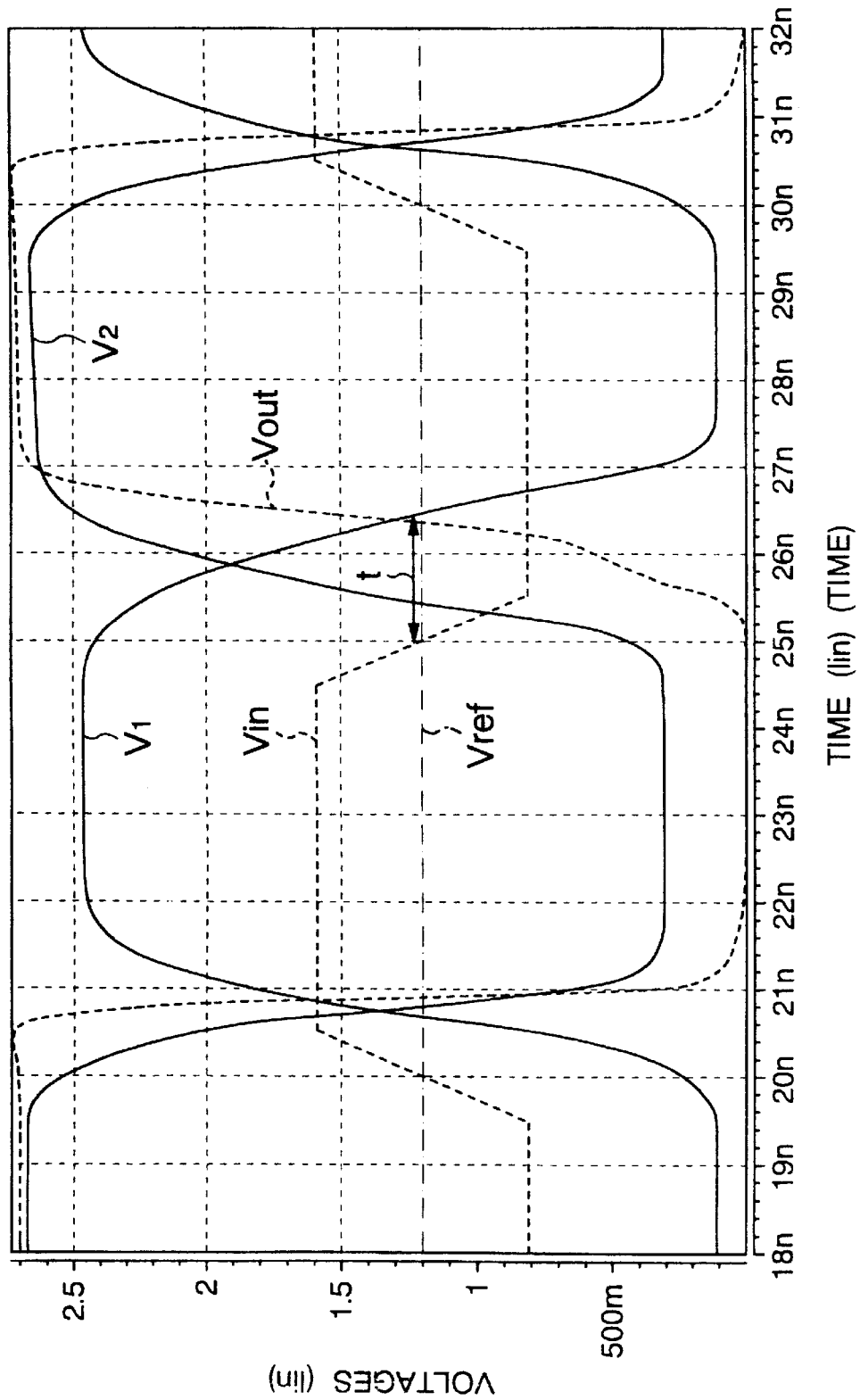
FIG. 4 is a waveform diagram for explaining the operation of the differential input circuit shown in FIG. 3.
Figure 6:
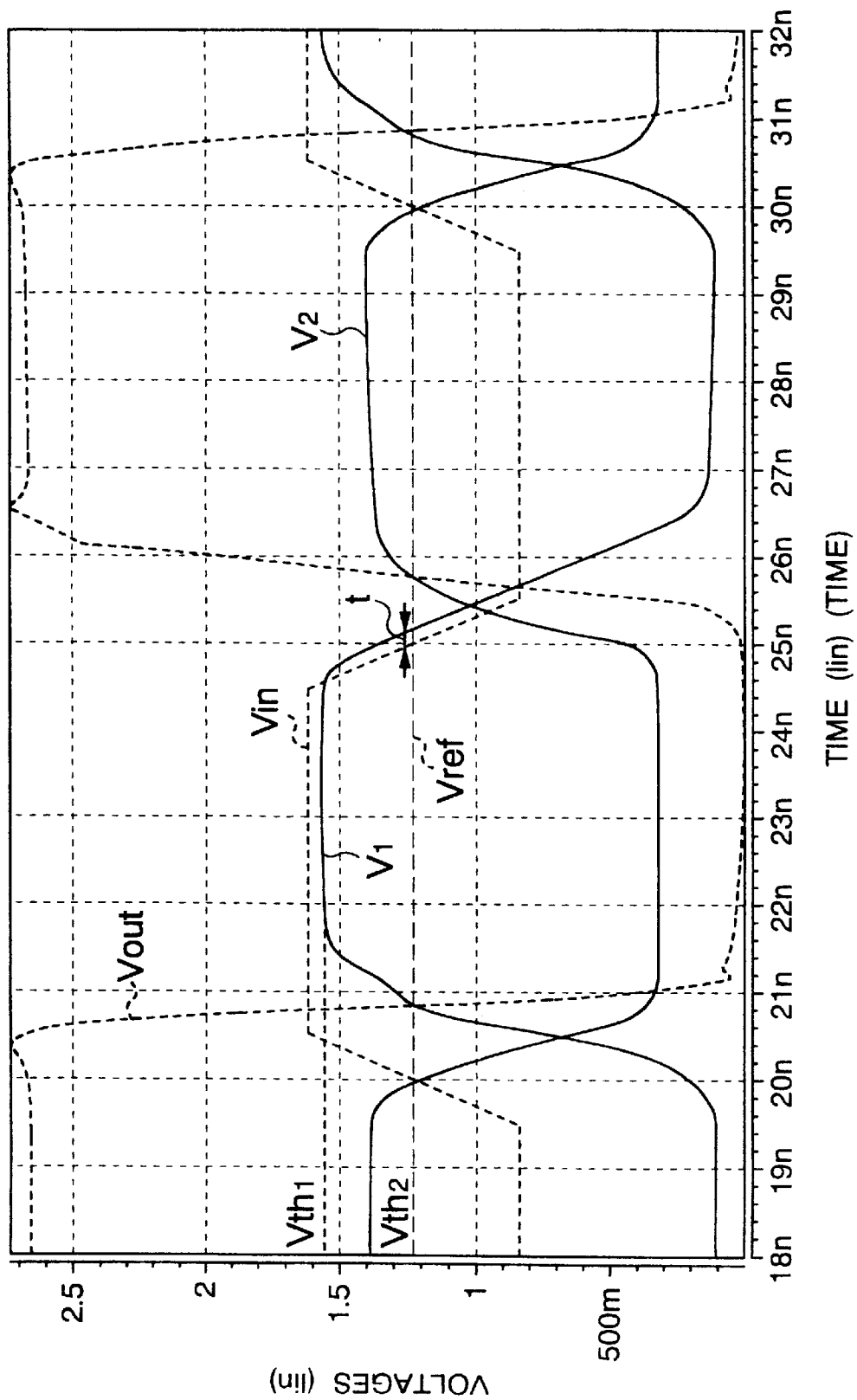
FIG. 6 is a waveform diagram for explaining the operation of the differential input circuit shown in FIG. 5.

In the differential input circuit according to the embodiment constructed as mentioned above, as shown in an interval from a time of 20 nsec to a time of 22 nsec in FIG. 6, the voltage level of the first differential voltage V1 which is generated by the first differential circuit 1 increases in proportion to the input voltage Vin and reaches the first threshold value Vth1 (in this example, about 1.55V) which is specified by the NMOS transistor N6. After that, the voltage level of the first differential voltage V1 does not increase any more but is held at the first threshold value Vth1. After that, as shown in an interval from a time of 24 nsec to a time of 27 nsec in FIG. 6, the first differential voltage V1 also trails in response to the drop of the input voltage Vin. However, since the voltage level of the first differential voltage V1 at a trailing time point of the input voltage Vin is held at the first threshold value Vth1, a time t which is required until the first differential voltage V1 reaches the reference voltage Vref is extremely shorter than that of the conventional differential input circuit (refer to FIG. 4). Therefore, since the first differential voltage V1 has already been smaller than the reference voltage Vref at a time point when the second differential voltage V2 rises and exceeds the reference voltage Vref, the switch from the first differential voltage V1 to the second differential voltage V2 is smoothly performed.

As shown in an interval from a time of 20 nsec to a time of 21.5 nsec in FIG. 6, since the second differential voltage V2 has already been smaller than the reference voltage Vref at a time point when the first differential voltage V1 rises and exceeds the reference voltage Vref, the switch from the second differential voltage V2 to the first differential voltage V1 is also smoothly performed.

As mentioned above, in the differential input circuit of the embodiment, by setting the threshold values Vth1 and Vth2 of the two clamping circuits to proper values (preferably, values near the amplitude level of the input voltage Vin), the switch from the first differential voltage V1 to the second differential voltage V2 and the switch from the second differential voltage V2 to the first differential voltage V1 can be smoothly performed. Thus, the leading time and trailing time of the output voltage Vout can be set to values shorter than those of the conventional differential input circuit.

The setting of the threshold values Vth1 and Vth2 of the two clamping circuits can be performed by changing gate widths of the NMOS transistors N6 and N7. That is, when the gate widths of the NMOS transistors N6 and N7 functioning as clamping circuits are set to large values, the threshold values Vth1 and Vth2 can be set to small values. On the contrary, when the gate widths of the NMOS transistors N6 and N7 are set to small values, the threshold values Vth1 and Vth2 can be set to large values. The differential input circuit according to the embodiment as mentioned above also has an advantage such that the voltage level to be clamped can be finely adjusted by changing the gate widths of the NMOS transistors N6 and N7. Thus, in case of supplying the output voltage Vout as an input voltage of the IC circuit which operates in response to a trailing edge of the input voltage, the threshold values Vth1 and Vth2 can be set so as to reduce the trailing time of the output voltage Vout. On the other hand, when supplying the output voltage Vout as an input voltage of the IC circuit which operates in response to the leading edge of the input voltage, the threshold values Vth1 and Vth2 can be set so as to reduce the leading time of the output voltage Vout.

(Second embodiment)

In the differential input circuit according to the foregoing first embodiment, since the threshold values Vth1 and Vth2 are fixed, in the first and second differential circuits 1 and 2, the threshold values Vth1 and Vth2 fluctuate in association with a fluctuation of a voltage for a mirror (hereinafter, referred to as a "mirror voltage Vmi") which is generated from the reference voltage Vref. Thus, for example, when the reference voltage Vref which is supplied from the outside such as a system bus of the computer or the like fluctuates or a variation of characteristics of each MOS transistor constructing the first and second differential circuits 1 and 2 and a variation of the power voltage Vdd occur, the mirror voltage Vmi fluctuates, so that the threshold values Vth1 and Vth2 fluctuate. There is, consequently, a case where the switch between the first differential voltage V1 and second differential voltage V2 cannot be smoothly performed.

Figure 7:
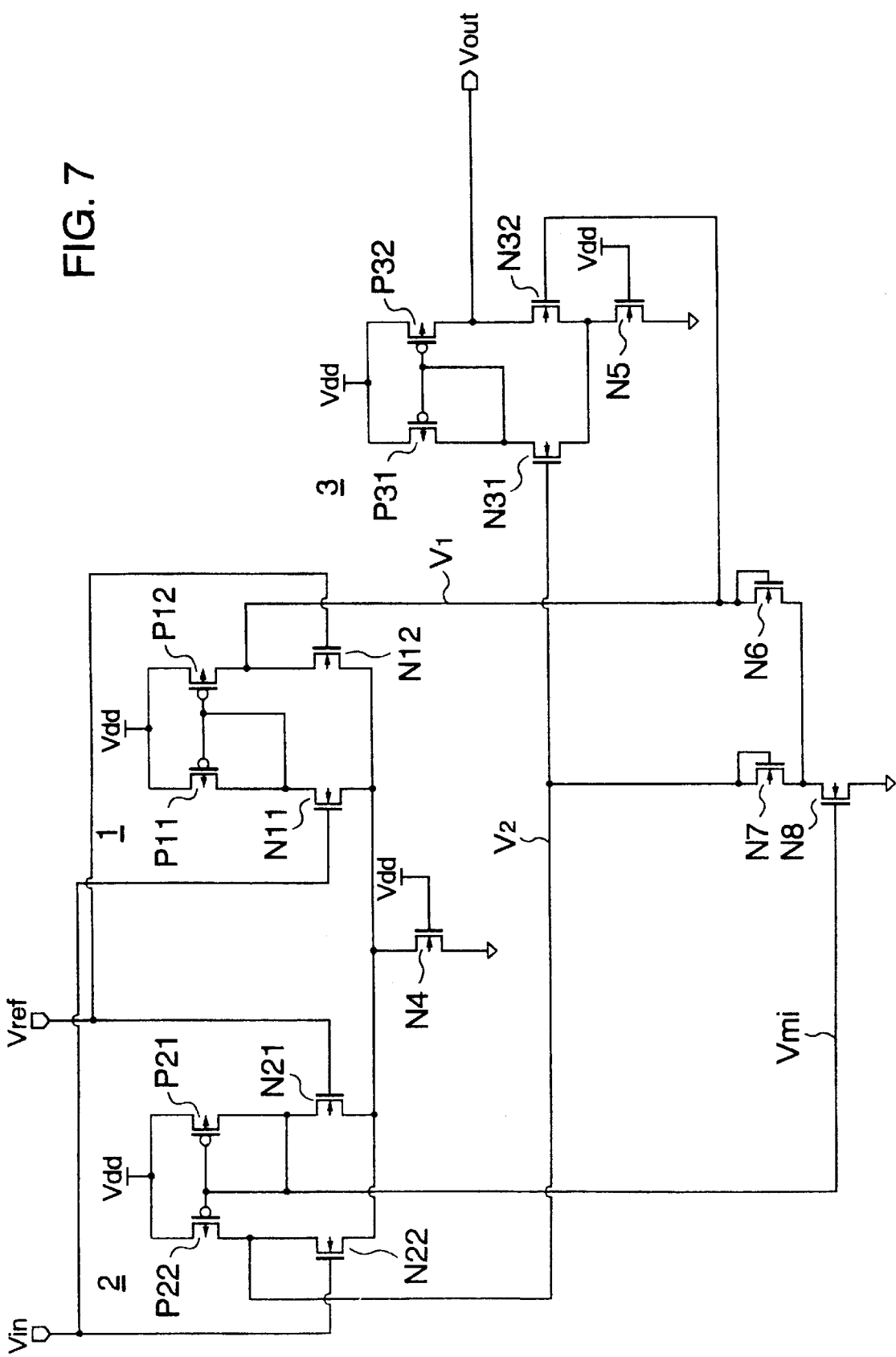
FIG. 7 is a circuit diagram showing a construction of a differential input circuit according to the second embodiment of the invention.

A differential input circuit according to the second embodiment of the invention differs from the differential input circuit according to the first embodiment shown in FIG. 5 in that even when the mirror voltage Vmi fluctuates, in order to enable the switch between the first and second differential voltages V1 and V2 to be smoothly performed, as shown in FIG. 7, the NMOS transistors N6 and N7 functioning as clamping circuits are connected to the ground through an NMOS transistor N8 in which the mirror voltage Vmi of the second differential circuit 2 is inputted to a gate. That is, in the differential input circuit according to this embodiment, the sources of the NMOS transistors N6 and N7 are connected to a drain of the NMOS transistor N8, a source of the NMOS transistor N8 is connected to the ground, and a gate of the NMOS transistor N8 is connected to the drain of the NMOS transistor N21 of the second differential circuit 2.

Figure 8:
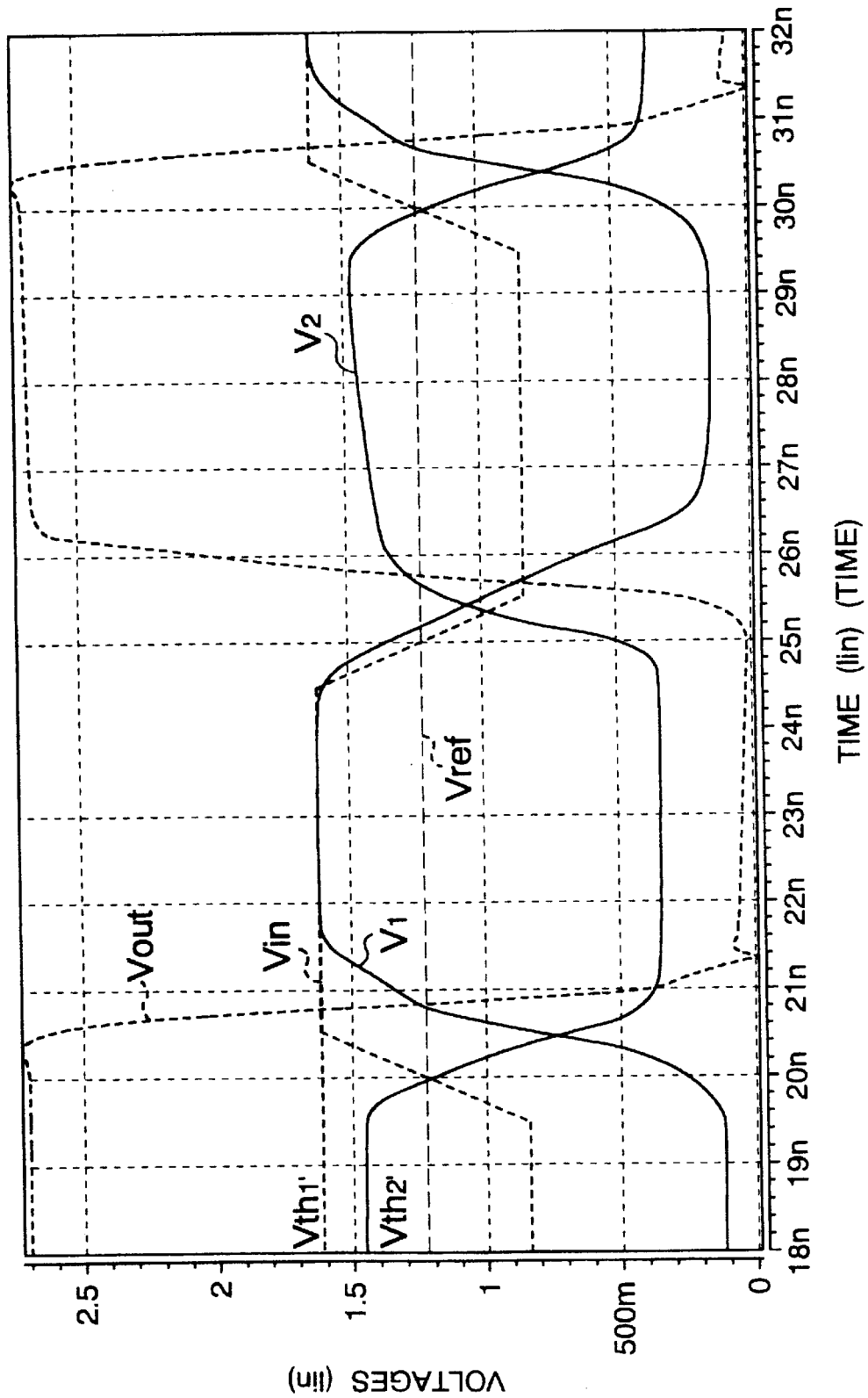
FIG. 8 is a waveform diagram for explaining the operation of the differential input circuit shown in FIG. 7.

In the differential input circuit according to the embodiment constructed as mentioned above, when the mirror voltage Vmi of the second differential circuit 2 increases, the drain voltage of the NMOS transistor N8 (namely, source voltage of the NMOS transistors N6 and N7 functioning as clamping circuits) also increases, so that the threshold values Vth1 and Vth2 decrease. When the mirror voltage Vmi of the second differential circuit 2 decreases, the drain voltage of the NMOS transistor N8 (namely, source voltage of the NMOS transistors N6 and N7 functioning as clamping circuits) also decreases, so that the threshold values Vth1 and Vth2 increase. For instance, FIG. 8 shows a waveform diagram when the threshold values Vth1 and Vth2 can be set to values larger than those shown in FIG. 6. In the diagram, the threshold values Vth1 and Vth2 are shown as threshold values Vth1' and Vth2'.

In the differential input circuit according to the embodiment, therefore, since the threshold values Vth1 and Vth2 can be changed in accordance with the fluctuation of the mirror voltage Vmi, if a fluctuation of the mirror voltage Vmi occurs due to a fluctuation of the reference voltage Vref, a variation in characteristics of the MOS transistor, and a variation of the power voltage Vdd, the switch between the first differential voltage V1 and second differential voltage V2 can be smoothly performed. In the differential input circuit according to the embodiment, although the mirror voltage Vmi of the second differential circuit 2 has been inputted to the gate of the NMOS transistor N8, a similar effect can be obtained even when the mirror voltage Vmi of the first differential circuit 1 is inputted to the gate of the NMOS transistor N8.

(Third embodiment)

Figure 9:
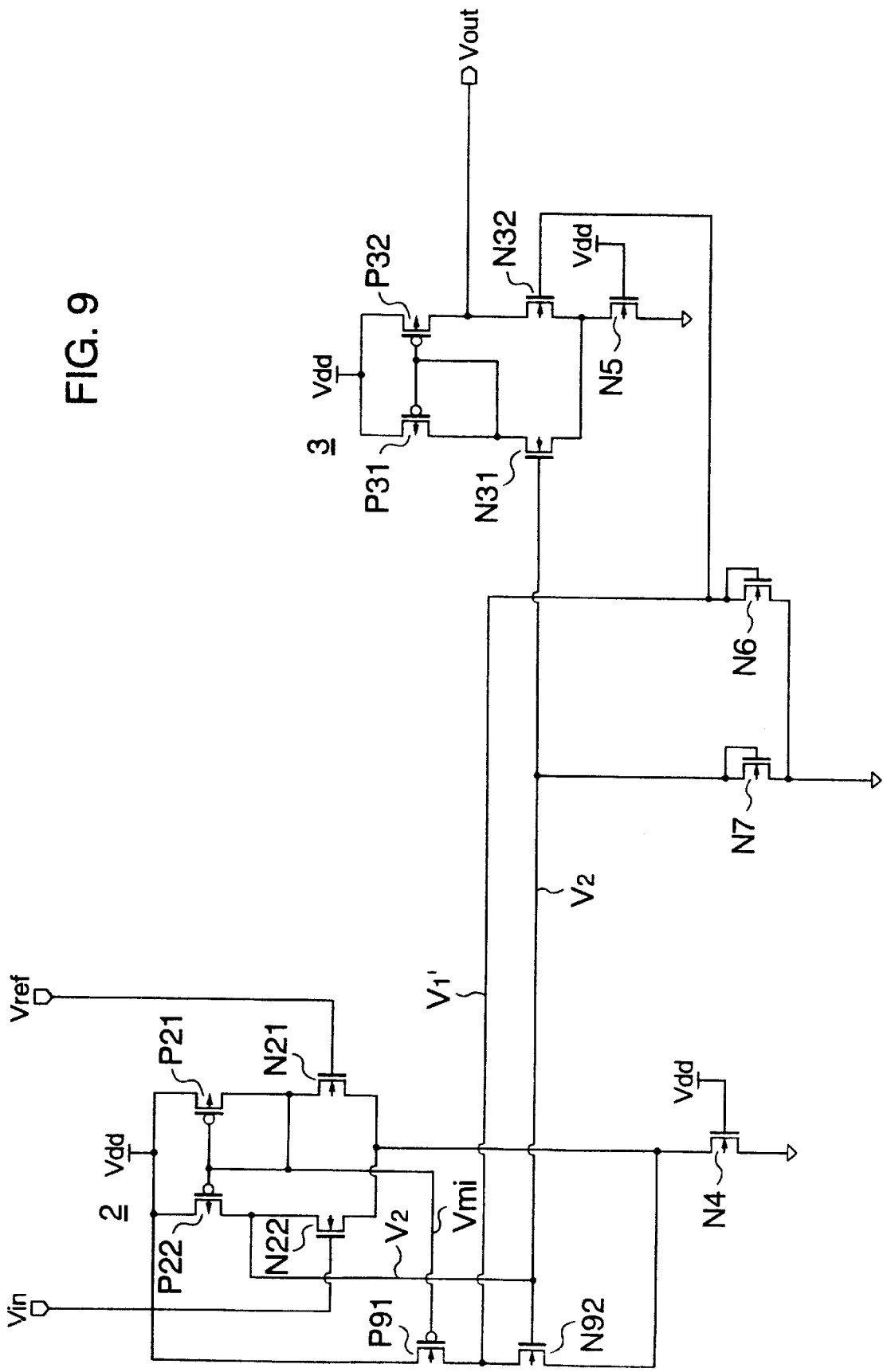
FIG. 9 is a circuit diagram showing a construction of a differential input circuit according to the third embodiment of the invention.

A differential input circuit according to the third embodiment of the invention differs from the differential input circuit according to the first embodiment of FIG. 5 in that, as shown in FIG. 9, in place of the first differential circuit 1, a PMOS transistor P91 and an NMOS transistor N92 functioning as an inverter circuit for generating a voltage V1' having a phase opposite to that of the second differential voltage V2 which is outputted from the second differential circuit 2 are provided. The voltage V1' which is outputted from the inverter circuit, therefore, is similar to the first differential voltage V1 which is outputted from the first differential circuit 1 shown in FIG. 5.

The mirror voltage Vmi which is generated from the reference voltage Vref in the second differential circuit 2 is inputted to a gate of the PMOS transistor P91. The power voltage Vdd is inputted to a source of the PMOS transistor P91. A drain of the PMOS transistor P91 is connected to a drain of the NMOS transistor N92 and their connecting point is connected to the gate of the NMOS transistor N32 of the third differential circuit 3 and the drain of the NMOS transistor N6 functioning as a clamping circuit. Thus, the voltage V1' is supplied to the gate of the NMOS transistor N32 of the third differential circuit 3 from this connecting point. The second differential voltage V2 which is outputted from the second differential circuit 2 is inputted a gate of the NMOS transistor N92. A source of the NMOS transistor N92 is connected to the ground through the NMOS transistor N4.

Figure 10:
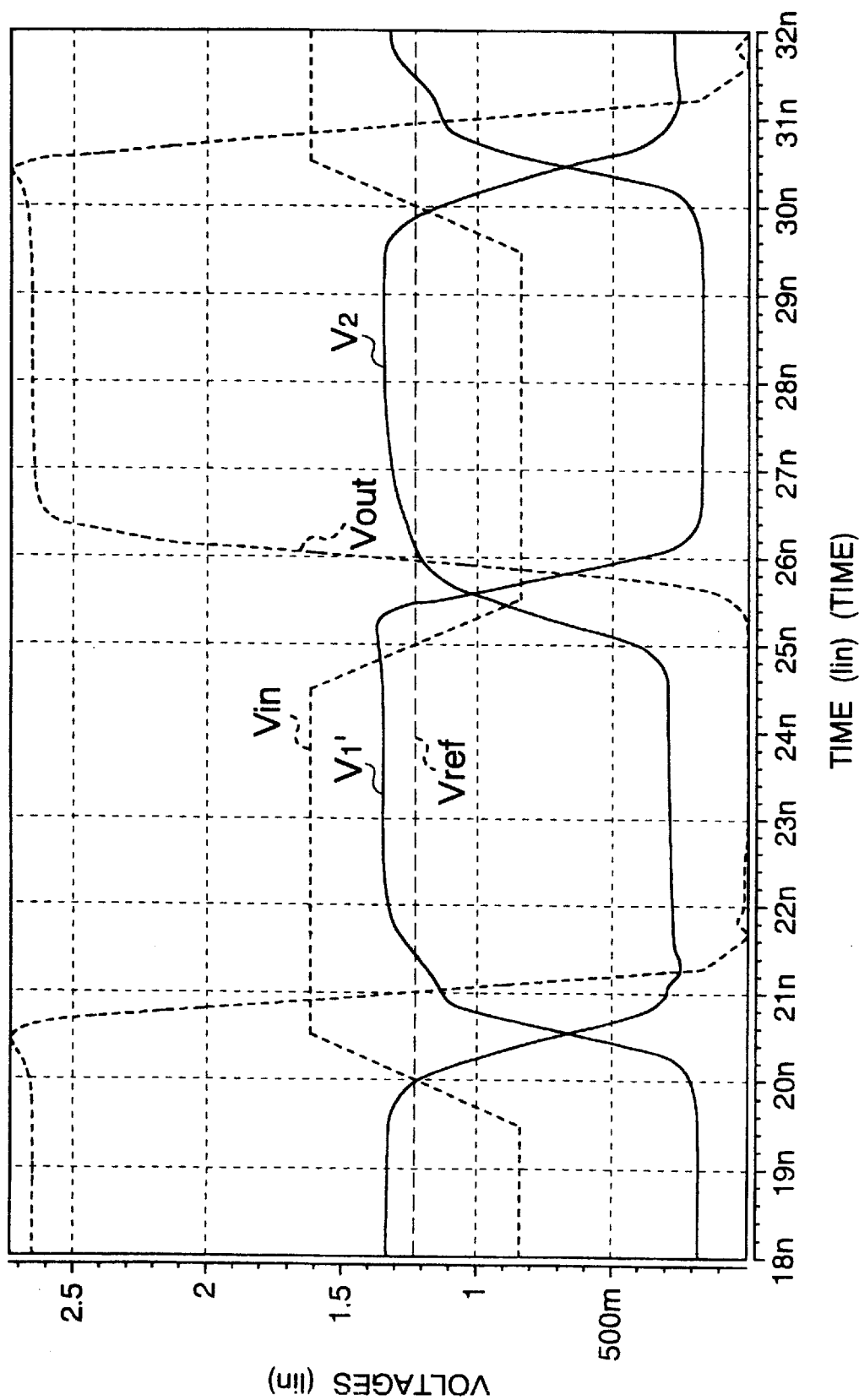
FIG. 10 is a waveform diagram for explaining the operation of the differential input circuit show in FIG. 9.

Even in the differential input circuit according to the embodiment, by generating the output voltage Vout by the third differential circuit 3 on the basis of the voltage V1' which is outputted from the connecting point of the drain of the PMOS transistor P91 and the drain of the NMOS transistor N92 and the second differential voltage V2 which is outputted from the second differential circuit 2, as shown in FIG. 10, the switch between the voltage V1' and the second differential voltage V2 can be smoothly performed. Thus, the leading time and trailing time of the output voltage Vout can be reduced from those of the conventional apparatus.

In the differential input circuits according to the foregoing first and second embodiments, since the first and second differential voltages V1 and V2 having opposite phases are generated by using the first and second differential circuits 1 and 2 constructed by a number of MOS transistors, a load when it is seen from a supply source of the input voltage Vin is large. On the other hand, in the differential input circuit according to the third embodiment, since the voltage V1' is generated by using the inverter circuit constructed of two MOS transistors in place of the first differential circuit 1, a load when it is seen from the supply source of the input voltage Vin can be further reduced. Thus, the delay time in the differential input circuit can be reduced and a higher speed of the amplifying operation can be realized.

Figure 11:
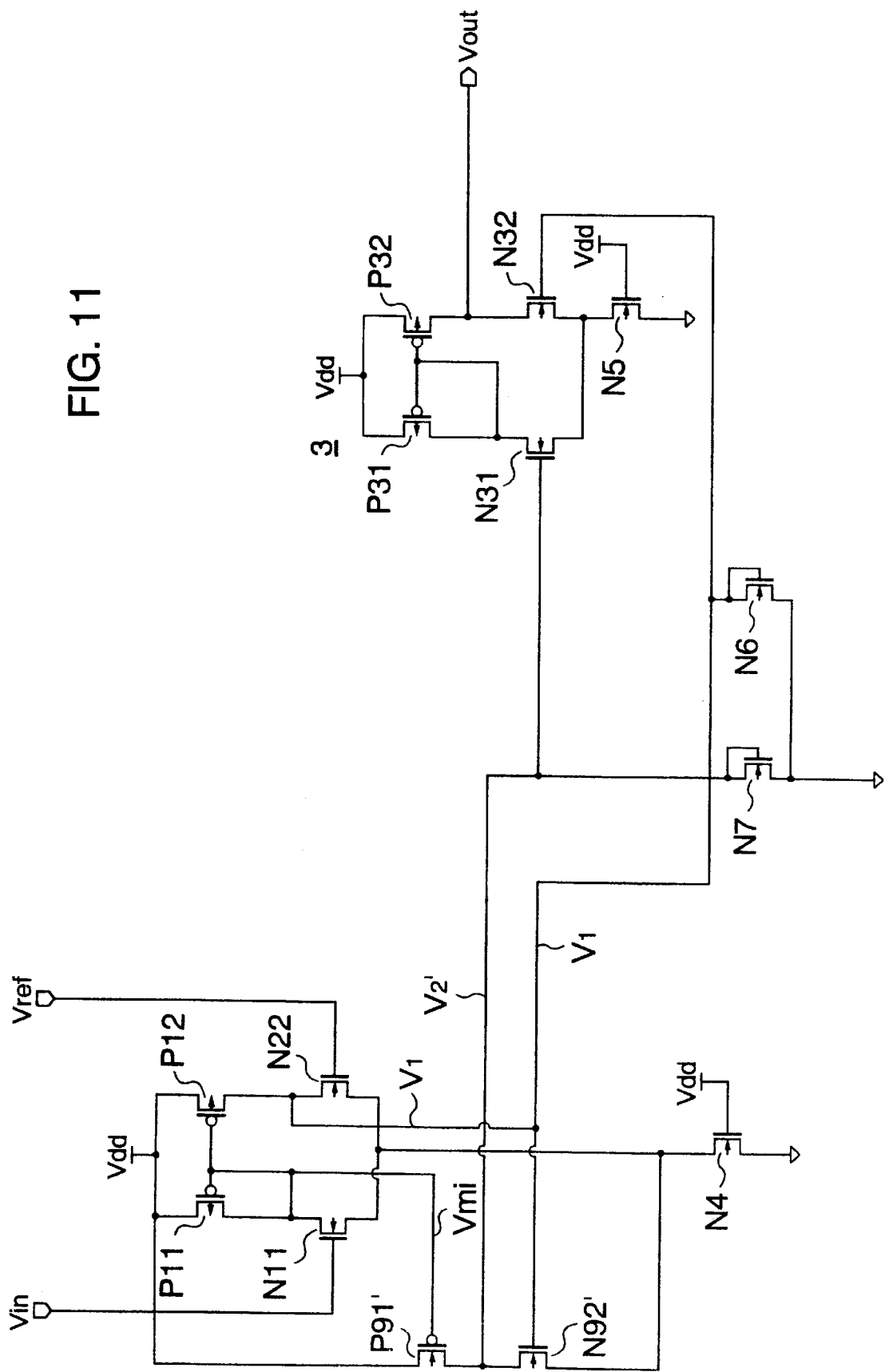
FIG. 11 is a circuit diagram showing a construction of a first modification of a differential input circuit according to the third embodiment of the invention.

In the differential input circuit according to the third embodiment, the voltage V1' is generated by using the inverter circuit constructed of two MOS transistors in place of the first differential circuit 1. As shown in FIG. 11, however, in place of the second differential circuit 2, the inverter circuit constructed of two MOS transistors (a PMOS transistor P91' and an NMOS transistor N92') is similarly used and a voltage V2' having a phase opposite to that of the first differential voltage V1 can be also generated on the basis of the first differential voltage V1.

The NMOS transistors N6 and N7 functioning as clamping circuits can be also connected to the ground through the NMOS transistor N8 as shown in FIG. 7. Particularly, in the differential input circuit according to the embodiment, since a symmetry of the circuit is lost, there is a case where the operations of the clamping circuit and second differential circuit 2 for generating the voltage V1' and second differential voltage V2 having mutually opposite phases become unstable. Therefore, a meaning of providing the NMOS transistor N8 in the differential input circuit in the embodiment is larger than that of the differential input circuit according to the second embodiment.

(Fourth embodiment)

Figure 12:
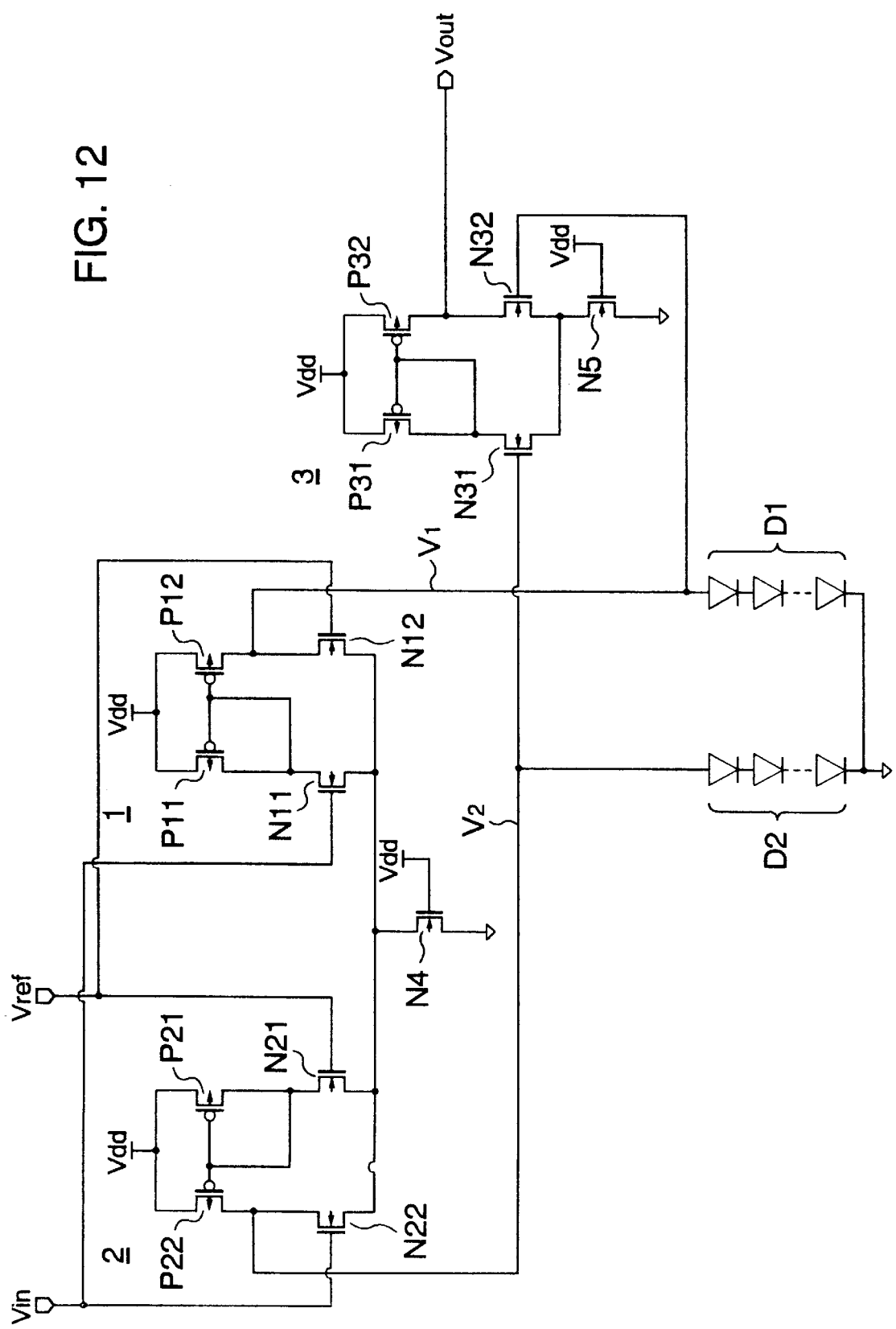
FIG. 12 is a circuit diagram showing a construction of a differential input circuit according to the fourth embodiment of the invention.

A differential input circuit according to the fourth embodiment of the invention differs from the differential input circuit according to the first embodiment shown in FIG. 5 in that, as shown in FIG. 12, in place of the NMOS transistor N6 functioning as a clamping circuit, a first diode train D1 comprising a plurality of diodes which are serially connected is used and, in place of the NMOS transistor N7 functioning as a clamping circuit, a second diode train D2 comprising a plurality of diodes which are serially connected is used.

In the differential input circuit according to the embodiment, the first differential voltage V1 which is outputted from the first differential circuit 1 is inputted to the anode side of the first diode train D1 and is clamped by the first diode train D1. After that, it is inputted to the NMOS transistor N32 of the third differential circuit 3. The second differential voltage V2 which is outputted from the second differential circuit 2 is inputted to the anode side of the second diode train D2 and is clamped by the second diode train D2. After that, it is inputted to the NMOS transistor N31 of the third differential circuit 3. Thus, the switch between the first differential voltage V1 and second differential voltage V2 can be smoothly performed. A clamping voltage can be changed by changing the numbers of diodes of the first and second diode trains D1 and D2. Therefore, the numbers of diodes of the first and second diode trains D1 and D2 can be also set to one in accordance with the clamping voltage.

(Fifth embodiment)

Figure 13:
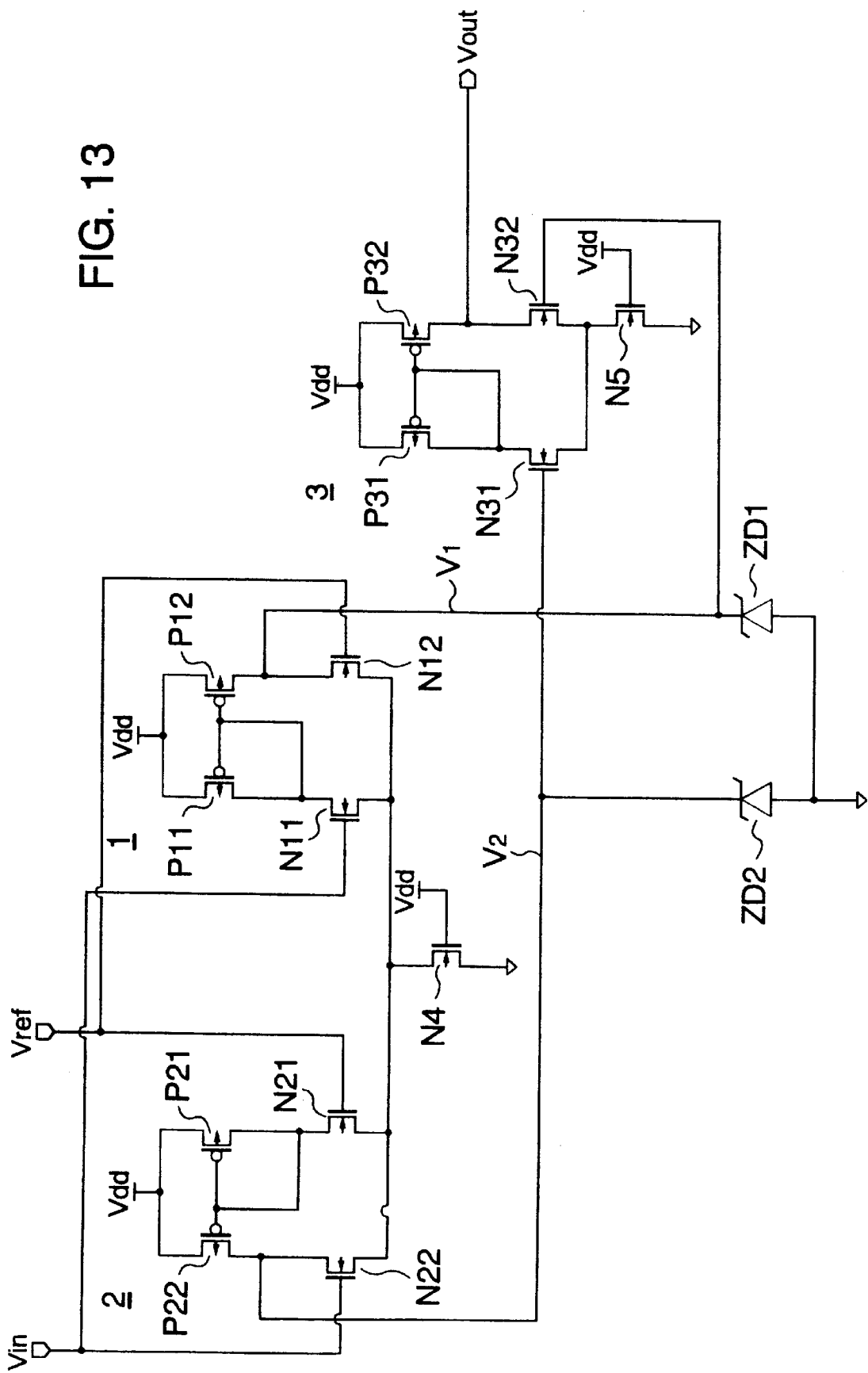
FIG. 13 is a circuit diagram showing a construction of a differential input circuit according to the fifth embodiment of the invention.

A differential input circuit according to the fifth embodiment of the invention differs from the differential input circuit according to the first embodiment shown in FIG. 5 in that, as shown in FIG. 13, as a clamping circuit, first and second Zener didoes ZD1 and ZD2 are used in place of the two NMOS transistors N6 and N7.

In the differential input circuit according to the embodiment, the first differential voltage V1 which is outputted from the first differential circuit 1 is inputted to an anode of the first Zener diode ZD1 and is clamped by the first Zener diode ZD1. After that, it is inputted to the NMOS transistor N32 of the third differential circuit 3. The second differential voltage V2 which is outputted from the second differential circuit 2 is inputted to an anode of the second Zener diode ZD2 and is clamped by the second Zener diode ZD2. After that, it is inputted to the NMOS transistor N31 of the third differential circuit 3. Therefore, the switch between the first differential voltage V1 and second differential voltage V2 can be smoothly performed.

In the differential input circuit according to the embodiment, the clamp voltage can be changed by changing the Zener voltages of the first and second Zener diodes ZD1 and ZD2. In a manner similar to the foregoing fifth embodiment, a first Zener diode train comprising a plurality of first Zener diodes which are mutually serially connected and a second Zener diode train comprising a plurality of second Zener didoes which are mutually serially connected can be also used as clamping circuits.

(Sixth embodiment)

In the above embodiments, it is an object to reduce the leading time or trailing time of the output voltage.

However, to actually construct a high speed input circuit, it is insufficient to merely reduce the leading time or trailing time.

In the present situation so that the operating speed of the CPU is raised and the transferring method using both the leading and trailing edges of the clock and the interface using a very small amplitude of about 0.4V have been put into practical use in association with the realization of the high operating speed, a circuit having a higher speed so that propagation delay times at the leading and, further, trailing timings of the input signal (input voltage) are equal and the propagation delay times are difficult to be influenced by the amplitude of the input signal is needed.

If a circuit construction to compensate the propagation delay time of the differential input circuit by using a technique such as DLL, PLL, or the like is used, it is required that the propagation delay times of the differential input circuit to which data is actually inputted and the dummy differential input circuit which is used to measure the delay time on the inside for correction are equal as much as possible.

Particularly, in this case, since it is difficult to know the amplitude of the signal which is actually inputted from the outside, it is necessary that the propagation delay time is difficult to be influenced by the amplitude of the input signal, as much as possible.

In case of the conventional differential input circuit, inclinations of the output of the differential circuit at the leading edge and trailing edge of the input signal are different. This is because in case of the circuit of FIG. 1, when the input signal rises over the reference voltage, the output of the differential circuit rapidly decreases by the NMOS transistor N11 to which a gate voltage higher than the reference voltage is applied and, on the other hand, when the input signal trails over the reference voltage, the current of the NMOS transistor N12 to which the reference voltage is applied to the gate is outputted through the current mirror circuit constructed by the PMOS transistors P11 and P12.

In a differential operation, the leading current is certainly larger than the trailing current. Such a difference between the inclinations due to it can be lightened to a certain extent by connecting the NMOS transistors N11 and N12 to the ground not directly, but via the constant current source.

However, to perfectly amend the time difference between the leading and trailing edges, it cannot help limiting to a fairly small current and, therefore, there is a drawback such that it is difficult to perform the high speed operation.

The center of the amplitude of the output of the differential circuit has no relation with the logical threshold value of an inverter IV1 to which the output is supplied. Further, the amplitude itself is determined from only the amplitude of the input signal irrespective of the voltage amplitude that is necessary for discrimination about "0" or "1" of the inverter IV1. Therefore, the time which is required from the timing when the signal is inputted to the differential circuit to the timing when it reaches the logical threshold value of the inverter IV1 complicatedly exerts an influence on various elements.

The sixth embodiment, therefore, is made to eliminate the above drawbacks. It is intended to provide a differential input circuit having an always predetermined propagation delay time.

There is also provided a differential input circuit having an almost predetermined propagation delay time at any timing of the leading edge and trailing edge of the output signal.

There is also provided a differential input circuit having an almost predetermined propagation delay time irrespective of the magnitude of the input signal.

Figure 14:
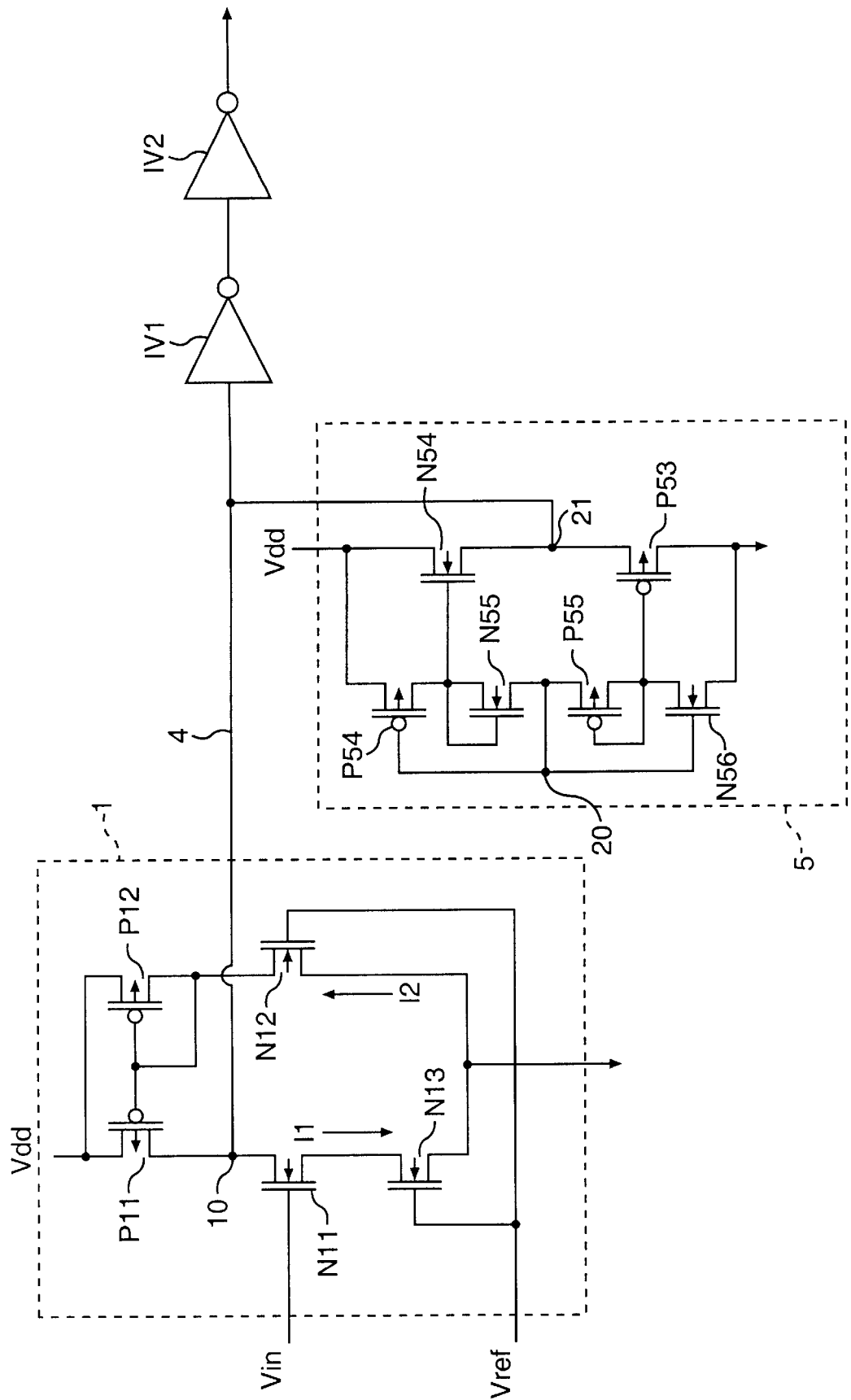
FIG. 14 is a circuit diagram showing a construction of a differential input circuit of the sixth embodiment of the invention.

FIG. 14 shows a differential input circuit of the sixth embodiment.

In the differential input circuit, the gate terminals of the PMOS transistors P11 and P12 are connected, and the drain terminals are connected to a power source voltage Vdd, thereby forming a current mirror circuit.

The source terminal of the PMOS transistor P12 is connected to a connecting point of the gate terminals of the PMOS transistors P11 and P12.

An output of a differential circuit 1' is derived at a differential output terminal 10 connected to the source terminal of the PMOS transistor P11.

The drain terminal of the NMOS transistor N11 is connected to the source terminal of the PMOS transistor P11. The drain terminal of the NMOS transistor N12 is connected to the source terminal of the PMOS transistor P12.

The input voltage (input signal) is supplied to the gate terminal of the NMOS transistor N11. The reference voltage (reference signal) is supplied to the gate terminal of the NMOS transistor N12.

Figure 1:
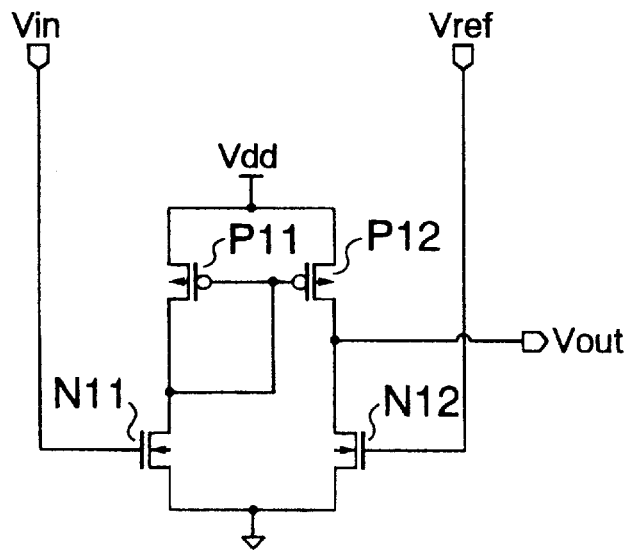
FIG. 1 is a circuit diagram showing an example of a construction of a conventional differential input circuit.
Figure 2:
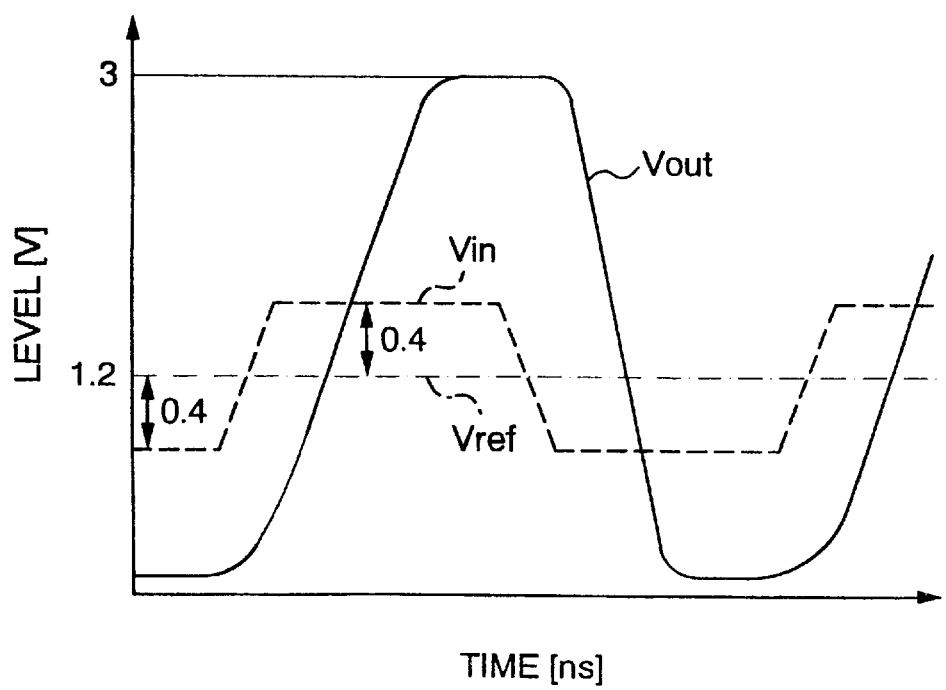
FIG. 2 is a waveform diagram for explaining the operation of the differential input circuit shown in FIG. 1.

The construction of the sixth embodiment until now is the same as that of the circuit of FIG. 1. In the differential input circuit in this embodiment, however, an NMOS transistor N13 of the same conductivity type as that of the NMOS transistor N11 is serially connected to the NMOS transistor N11. The reference signal is supplied to the gate terminal of the NMOS transistor N12 and is also supplied to a gate terminal of the NMOS transistor N13.

The gate width of the NMOS transistor N11 and the gate width of the NMOS transistor N13 are set to a length that is twice as large as the gate width of the NMOS transistor N12. Therefore, in case of seeing equivalent resistances (equivalent circuits) of the NMOS transistors N11, N13 and N12, the equivalent resistance of the serial circuit of the NMOS transistors N11 and N13 and the equivalent resistance of the NMOS transistor N12 are almost equal. A current (shown by an arrow I1 in FIG. 14), which is extracted from the differential output terminal 10 through the NMOS transistors N11 and N13 when the input signal is larger than the reference signal, and a current (shown by an arrow I2 in FIG. 14), which is inputted to the differential output terminal 10 through the circuit of the NMOS transistor N12 and PMOS transistors P11 and P12 when the input signal is smaller than the reference signal, are almost equal. A leading waveform and a trailing waveform of the signal which is outputted to the differential output terminal 10 are almost equal.

In the differential input circuit according to this embodiment, further, in order to solve the problem that when the input signal has a large signal level, the propagation delay times of the leading and trailing edges of the signal are different, an amplitude limiting circuit 5 for limiting an amplitude is connected to a signal line 4 connecting the differential output terminal 10 and the inverter IV1 (logic gate) at the post stage.

The amplitude limiting circuit 5 is set so as to maintain a reference potential (electric potential when the input signal and the reference signal are the same) of a signal line 6 at a value near the logical threshold value of the inverter IV1 at the post stage.

When the amplitude of the input signal is small, an amplitude of the output of the differential circuit 1' is small and the signal swings at the value near the logical threshold value of the inverter IV1 by the amplitude limiting circuit 5. Therefore, even the input signal of a small amplitude can exceed the logical threshold value of the inverter IV1 at a high speed.

On the other hand, when the amplitude of the input signal is large, since an effect of the amplitude limiting circuit 5 is insufficient, the signal swings relatively largely.

A response speed of the differential circuit 1' itself is higher as the amplitude of the input signal is larger. That is, angles of the leading and trailing edges are sharp like a signal waveform shown by a broken line in FIG. 15.

Figure 15:
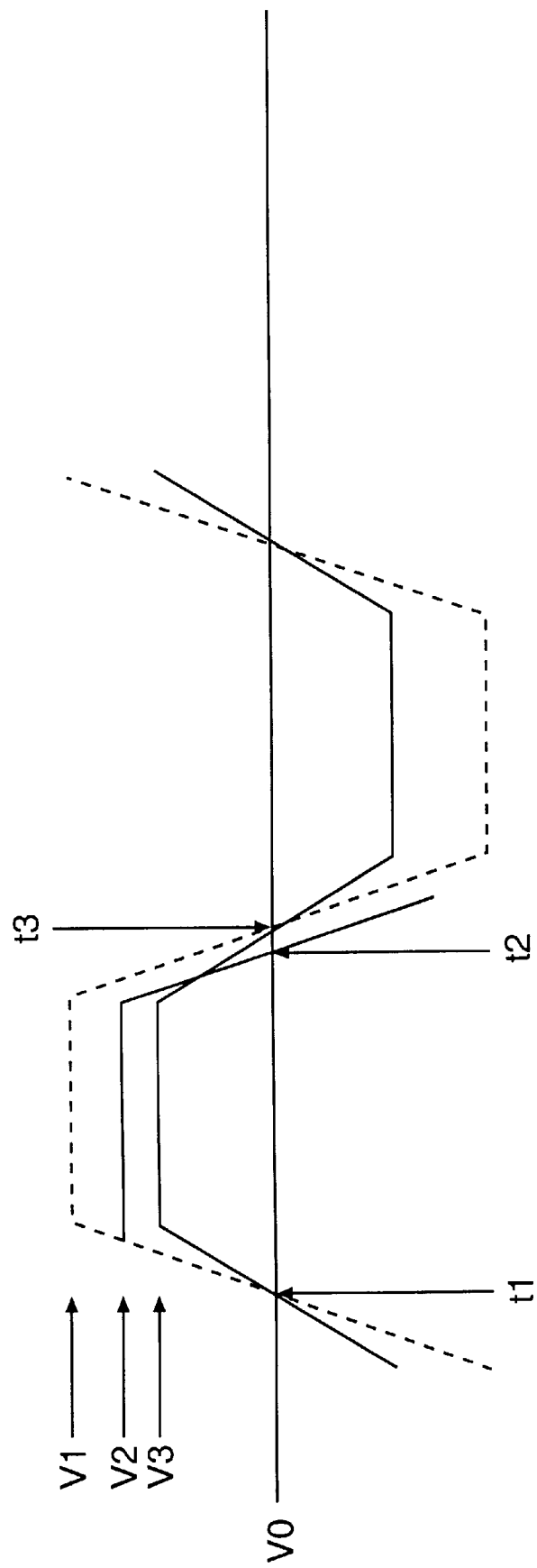
FIG. 15 is a waveform diagram showing the operation of the differential input circuit of the sixth embodiment of the invention.

When the amplitude limiting circuit 5 excessively powerfully limits the amplitude, for example, when it is assumed that the amplitude is limited to a voltage shown at V2 in FIG. 15, even at the trailing edge, the signal also soon trails in response to the sharp angle of the leading edge and exceeds a threshold value V0 earlier than the trailing timing of the signal (signal waveform shown by a solid line in FIG. 15) of a small amplitude. A problem that the propagation delay times differ depending on the amplitude of the input signal occurs.

In the differential input circuit in the embodiment, therefore, when the amplitude of the input signal is large, it is set so that the function of the amplitude limiting circuit 5 is not so largely effected.

Therefore, when the amplitude of the input signal is large, since the amplitude of the input of the inverter IV1 is large, it takes time until the potential reaches the logical threshold value of the inverter IV1 at the time of trailing (signal waveform shown by the broken line in FIG. 15). The same propagation delay time as time t3 until reaching the logical threshold value of the inverter IV1 can be obtained at the time of a small amplitude. That is, the speed of the differential circuit 1' is set off and the propagation delay time which does not depend on the amplitude of the input signal can be obtained.

The above amplitude limiting circuit 5 is constructed by a circuit obtained by connecting in parallel two serial circuits comprising: a first serial circuit in which an NMOS transistor N54 and a PMOS transistor P53 are complementarily connected; and a second serial circuit of a PMOS transistor P54, an NMOS transistor N55, a PMOS transistor P55 and an NMOS transistor N56.

The second serial circuit operates in such a manner that the electric potential at a middle point 20 is supplied to each gate terminal of the PMOS transistor P54 and NMOS transistor N56 and the potential at the middle point 20 divides the power source voltage Vdd and is set to a value near the logical threshold value of the inverter IV1. Profiles of the PMOS transistor P54 and NMOS transistor N56 are set in such a manner that the potential at the middle point 20, which is determined by a ratio of sizes of the PMOS transistor P54 and NMOS transistor N56, is equal to a ratio of sizes of a PMOS transistor (not shown) and an NMOS transistor (not shown) constructing the inverter IV1.

A voltage which is deviated from the middle point 20 of the second serial circuit by only a threshold voltage of the NMOS transistor N55 and PMOS transistor P55 is inputted to each gate terminal of the NMOS transistor N54 and PMOS transistor P53 of the first serial circuit. In the case where the potential at a middle point 21 of the first serial circuit is deviated from the value near the logical threshold value of the inverter IV1, the circuit operates so as to return the potential at the middle point 21 to the value near the logical threshold value of the inverter IV1.

By changing the ratio of the NMOS transistors N5 and N4, a degree of effect of the amplitude limitation can be changed. The maximum value of the amplitude is determined by a ratio of the PMOS transistors P51 and P53. The minimum value of the amplitude is decided by ratios of the NMOS transistors N51 and N52 and the NMOS transistor N54.

As shown in FIG. 15, those ratios which are set are determined in design in a manner such that the propagation delay times at the time of the small amplitude and large amplitude are almost equal.

As mentioned above, in the differential input circuit according to this embodiment, since the NMOS transistor N13 for current limitation is provided serially for the NMOS transistor N11 for signal input, the inclinations of the leading and trailing edges of the input signal can be equalized. Moreover, since the amplitude limiting circuit 5 in which the logical threshold value of the inverter IV1 is set to the center is provided between the output of the differential circuit 1' and the inverter IV1, an output amplitude of the differential circuit 1' in which the logical threshold value of the inverter IV1 is set to the center is obtained. Therefore, the propagation delay times at the leading and trailing edges of the input signal can be equalized.

Further, by weakly effecting the amplitude limiting circuit 5, the speed difference depending on the amplitude of the input signal of the differential circuit 1' can be set off.

As described above, according to this embodiment, the differential input circuit always having the predetermined propagation delay time can be obtained. Specifically, the differential input circuit having almost the predetermined propagation delay time can be obtained at any one of the timings of the leading edge and trailing edge of the output signal.

The differential input circuit having almost the predetermined propagation delay time can be obtained irrespective of the magnitude of the input signal.

(Seventh embodiment)

Figure 16:
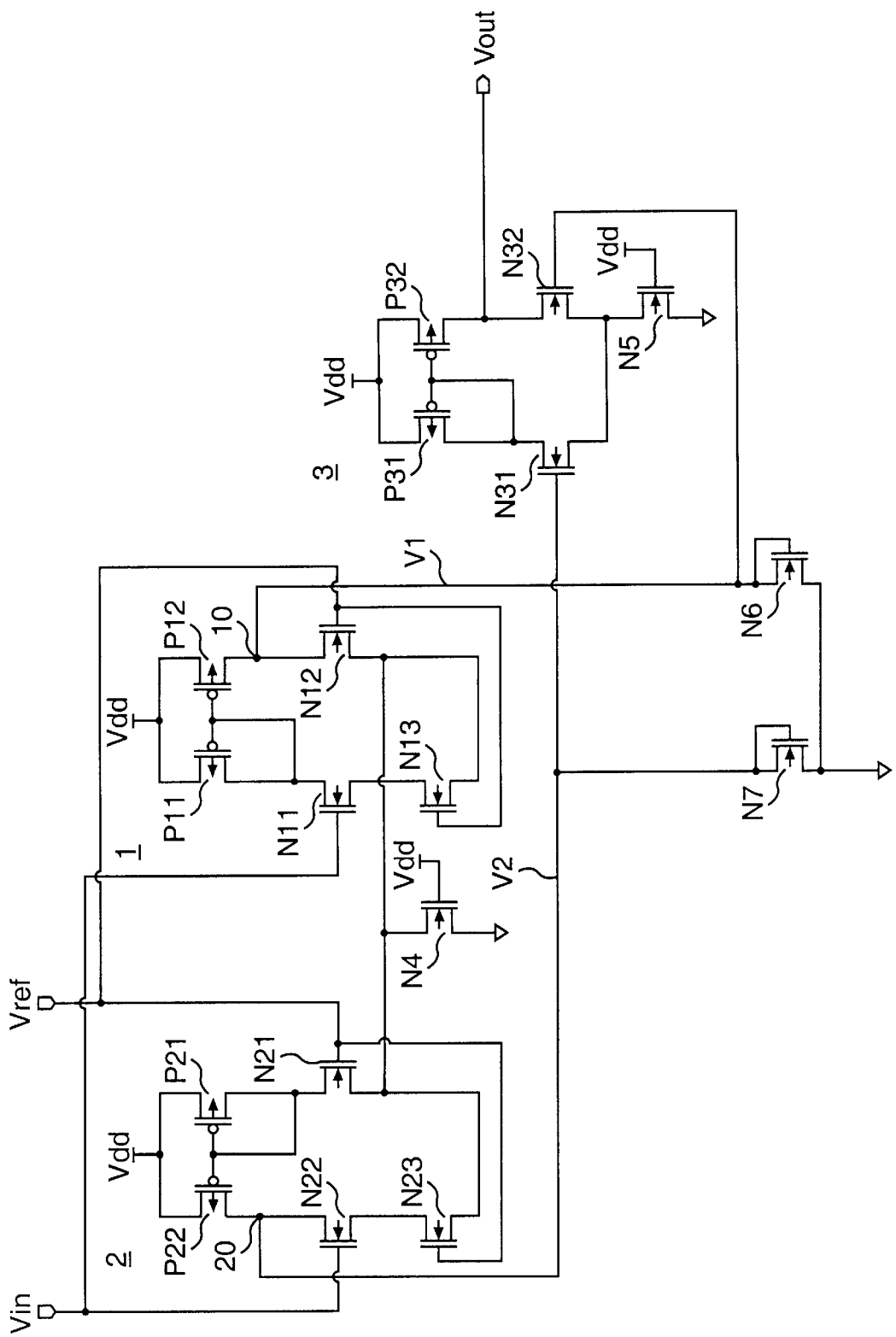
FIG. 16 is a circuit diagram showing a construction of a differential input circuit of the seventh embodiment of the invention.

FIG. 16 shows an example in the case where the current mirror circuit 1' of the sixth embodiment is applied to the differential input circuit of the embodiment disclosed in FIG. 5. As compared with the circuit of FIG. 5, NMOS transistors N13 and N23 are serially connected to the NMOS transistors N11 and N22 of the first and second differential circuits 1 and 2 and a reference voltage Vref is supplied to gates of the NMOS transistors N13 and N23.

The gate width of the NMOS transistor N11 and the gate width of the NMOS transistor N13 are set to a width that is twice as long as the gate width of the NMOS transistor N12.

Therefore, when seeing equivalent resistances (equivalent circuits) of the NMOS transistor N11, NMOS transistor N13, and NMOS transistor N12, the equivalent resistance of the serial circuit of the NMOS transistors N11 and N13 and the equivalent resistance of the NMOS transistor N12 are almost the same values. A current which is extracted from the differential output terminal 10 through the NMOS transistors N11 and N13 when the input signal is larger than the reference signal and a current (shown by an arrow I2 in FIG. 14) which is supplied to the differential output terminal through the circuit of the NMOS transistor N12 and PMOS transistors P11 and P12 when the input signal is smaller than the reference signal are almost equal. The leading waveform and the trailing waveform of the signal which is outputted to the differential output terminal 10 are almost equal.

A gate width of the NMOS transistor N21 and a gate width of the NMOS transistor N23 are set to a length that is twice as large as a gate width of the NMOS transistor N22. Therefore, even in the current mirror circuit 2, a leading waveform and a trailing waveform of the signal which is outputted to the differential output terminal 10 are also similarly almost equal.

(Eighth embodiment)

Figure 17:
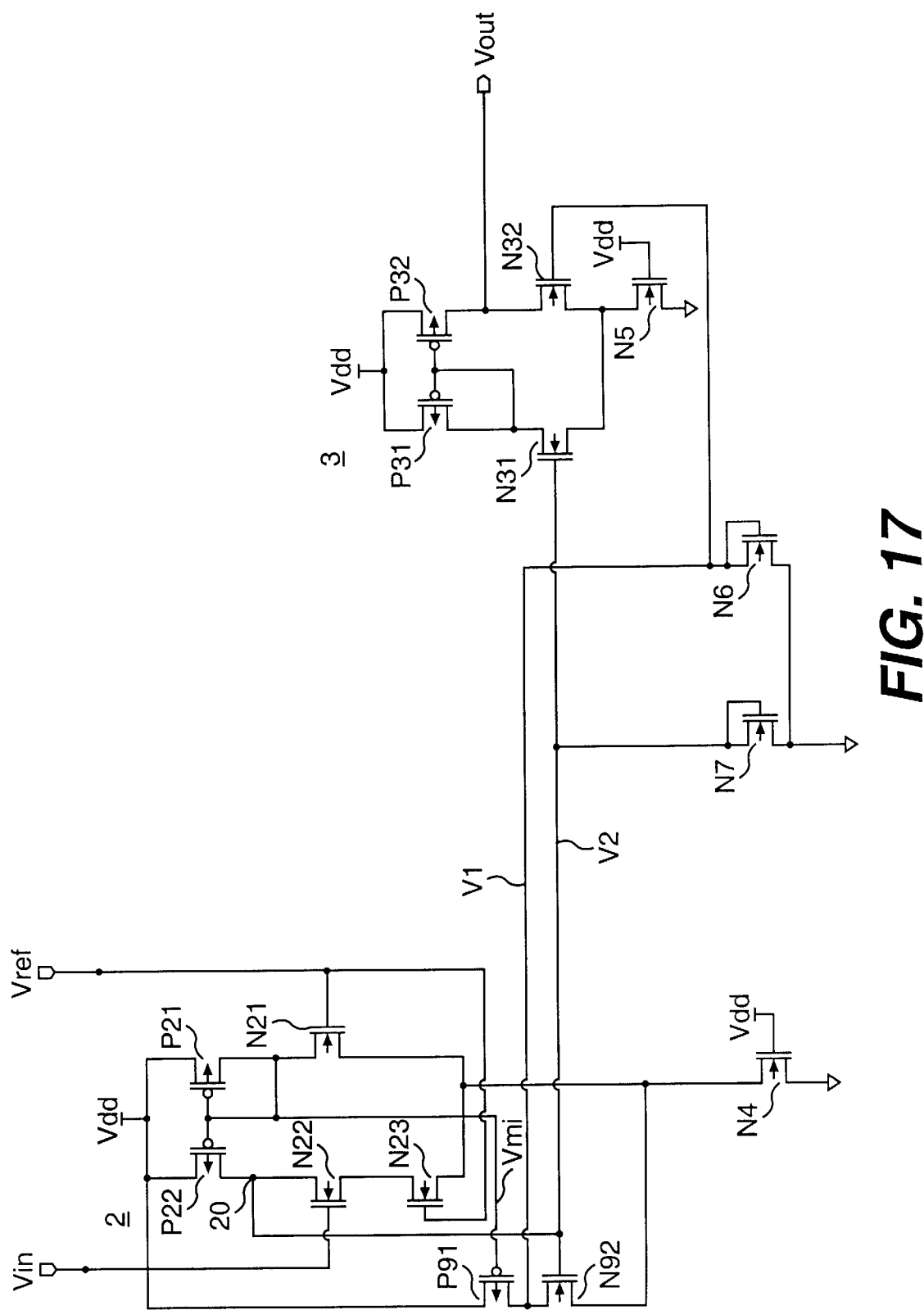
FIG. 17 is a circuit diagram showing a construction of a differential input circuit of an eighth embodiment of the invention.

FIG. 17 shows an example in the case where the current mirror circuit 1' of the sixth embodiment is applied to the differential input circuit of the embodiment shown in FIG. 9. As compared with the circuit of FIG. 9, the NMOS transistor N23 is serially connected to the NMOS transistor N22 of the differential circuit 2 and the reference voltage Vref is supplied to the gate of the NMOS transistor N23.

The gate width of the NMOS transistor N22 and the gate width of the NMOS transistor N23 are set to a length that is twice as large as the gate width of the NMOS transistor N21.

In this example as well, the differential input circuit always having a predetermined propagation delay time can be similarly obtained. Specifically speaking, the differential input circuit having almost the predetermined propagation delay time can be obtained at any one of the timings of the leading edge and trailing edge of the output signal.

In this circuit as well, by connecting the amplitude limiting circuit 5 used in FIG. 14 in place of the NMOS transistors N6 and N7 for clamping, the differential input circuit having almost the predetermined propagation delay time can be obtained irrespective of the magnitude of the input signal.

Further, although not shown, it will be obviously understood that it is possible to construct in a manner such that the NMOS transistor N13 is serially connected to the NMOS transistor N11 of the circuit of FIG. 11 and the reference voltage Vref is supplied to the gate of the NMOS transistor N13.

What is claimed is:

1. A differential input circuit comprising:

a first differential circuit of a current mirror type for generating a first differential voltage by using an input voltage and a reference voltage;

a second differential circuit of a current mirror type for generating a second differential voltage having a phase opposite to that of said first differential voltage by using said input voltage and said reference voltage;

a third differential circuit for generating an output voltage corresponding to a difference voltage between said first differential voltage and said second differential voltage by using said first and second differential voltages;

a first clamping circuit, provided between said first differential circuit and said third differential circuit, for clamping said first differential voltage, said first clamping circuit includes a first MOS transistor having a first drain to which said first differential voltage is inputted, a first gate connected to said first drain, and a first source connected to a ground; and a second clamping circuit, provided between said second differential circuit and said third differential circuit, for clamping said second differential voltage, said second clamping circuit includes a second MOS transistor having a second drain to which said second differential voltage is inputted, a second gate connected to said second drain, and a second source connected to the ground wherein said first source of said first MOS transistor and said second source of said second MOS transistor are connected to the ground through a third MOS transistor having a third gate to which a first mirror voltage generated in said first differential circuit or a second mirror voltage generated in said second differential circuit is inputted.

2. A differential input circuit comprising:

a first differential circuit of a current mirror type for generating a first differential voltage by using an input voltage and a reference voltage;

a second differential circuit of a current mirror type for generating a second differential voltage having a phase opposite to that of said first differential voltage by using said input voltage and said reference voltage;

a third differential circuit for generating an output voltage corresponding to a difference voltage between said first differential voltage and said second differential voltage by using said first and second differential voltages;

a first clamping circuit, provided between said first differential circuit and said third differential circuit, for clamping said first differential voltage; and a second clamping circuit, provided between said second differential circuit and said third differential circuit, for clamping said second differential voltage, wherein each of said first and second differential circuits comprises:

a first transistor to which an input signal is supplied;

a second transistor to which a reference signal is supplied;

a pair of transistors having a conductivity type different from that of said first and second transistors; and a transistor for current limitation which is serially connected to said first transistor and has the same conductivity type as that of said first transistor, and in which said reference signal is supplied to a gate.

3. A circuit according to claim 2, wherein in the case where each of said transistors is replaced to an equivalent circuit, a profile of the transistor is determined in a manner such that a magnitude of an equivalent resistance of the serial circuit of said first transistor and said transistor for current limitation is almost equal to a magnitude of an equivalent resistance of said second transistor.

4. A circuit according to claim 3, wherein a gate width of each of said first transistor and said transistor for current limitation is set to a width that is almost twice as large as a gate width of said second transistor.

5. A differential input circuit comprising:

a first differential circuit of a current mirror type for generating a first differential voltage by using an input voltage and a reference voltage, said first differential circuit including:

a first NMOS transistor having a first gate to which said input signal is inputted, a first source, and a first drain, a second NMOS transistor having a second gate to which said reference signal is inputted, a second source connected to said first source, and a second drain, a first PMOS transistor having a third gate connected to said first drain, a third source, and a third drain connected to said first drain and said third gate, and a second PMOS transistor having a fourth gate connected to said third gate, a fourth source connected to said third source, and a fourth drain connected to said second drain, said first differential voltage being outputted from a connecting point of said second drain and said fourth drain;

a second differential circuit of a current mirror type for generating a second differential voltage having a phase opposite to that of said first differential voltage by using said input voltage and said reference voltage, said second differential circuit including:

a third NMOS transistor having a fifth gate to which said reference signal is inputted, a fifth source connected to said first source, and a fifth drain, a fourth NMOS transistor having a sixth gate to which said input signal is inputted, a sixth source connected to said first source and said fifth source, and a sixth drain, a third PMOS transistor having a seventh gate connected to said fifth drain, a seventh source, and a seventh drain connected to said fifth drain and said seventh gate, and a fourth PMOS transistor having an eighth gate connected to said seventh gate, an eighth source connected to said seventh source, and an eighth drain connected to said sixth drain, said second differential voltage being outputted from a connecting point of said sixth drain and said eighth drain;

a third differential circuit for generating an output voltage corresponding to a difference voltage between said first differential voltage and said second differential voltage by using said first and second differential voltages;

a first clamping circuit, provided between said first differential circuit and said third differential circuit, for clamping said first differential voltage, said first clamping circuit includes a fifth NMOS transistor having a ninth gate to which said first differential voltage is inputted, a ninth source, and a ninth drain connected to said ninth gate;

a second clamping circuit, provided between said second differential circuit and said third differential circuit, for clamping said second differential voltage, said second clamping circuit includes a sixth NMOS transistor having a tenth gate to which said second differential voltage is inputted, a tenth source connected to said ninth source, and a tenth drain connected to said tenth gate; and a seventh NMOS transistor having an eleventh drain connected to said ninth source of said fifth NMOS transistor and said tenth source of said sixth NMOS transistor, an eleventh gate to which a first mirror voltage generated in said first differential circuit or a second mirror voltage generated in said second differential circuit is inputted, and an eleventh source connected to the ground.

6. A differential input circuit comprising:

a first differential circuit of a current mirror type for generating a differential voltage by using an input voltage and a reference voltage;

an inverter circuit for generating a voltage having a phase opposite to that of said differential voltage by using said differential voltage;

a second differential circuit for generating an output voltage corresponding to a difference voltage between said differential voltage and said voltage by using said differential voltage and said voltage;

a first clamping circuit, provided between said first differential circuit and said second differential circuit, for clamping said differential voltage; and a second clamping circuit, provided between said inverter circuit and said second differential circuit, for clamping said voltage.

7. A circuit according to claim 6, wherein said inverter circuit includes:
   a first MOS transistor having a first gate to which said differential voltage is inputted and a first source which is connected to a ground; and
   a second MOS transistor having a second gate to which a mirror voltage generated in said differential circuit, a second source to which a power voltage is supplied, and a second drain connected to a first drain of said first MOS transistor,
   and wherein said voltage is outputted from a connecting point of said first drain and said second drain.

8. A circuit according to claim 7, wherein
   said first clamping circuit includes a third MOS transistor having a third drain to which said differential voltage is inputted, a third gate connected to said third drain, and a third source connected to the ground, and
   said second clamping circuit includes a fourth MOS transistor having a fourth drain to which said voltage is inputted, a fourth gate connected to said fourth drain, and a fourth source connected to the ground.

9. A circuit according to claim 8, wherein said third source of said third MOS transistor and said fourth source of said fourth MOS transistor are connected to the ground through a fifth MOS transistor having a fifth gate to which said mirror voltage is inputted.

10. A circuit according to claim 7, wherein
    said first clamping circuit includes a first diode having a first anode to which said differential voltage is inputted and a first cathode connected to the ground, and
    said second clamping circuit includes a second diode having a second anode to which said voltage is inputted and a second cathode connected to the ground.

11. A circuit according to claim 10, wherein said first and second diodes are Zener diodes.

12. A circuit according to claim 6, wherein
    said first differential circuit includes
    a first NMOS transistor having a first gate to which said reference signal is inputted, a first source, and a first drain,
    a second NMOS transistor having a second gate to which said input signal is inputted, a second source connected to said first source, and a second drain,
    a first PMOS transistor having a third gate connected to said first drain, a third source, and a third drain connected to said first drain and said third gate, and
    a second PMOS transistor having a fourth gate connected to said third gate, a fourth source connected to said third source, and a fourth drain connected to said second drain,
    said differential voltage being outputted from a connecting point of said second drain and said fourth drain,
    said inverter circuit includes
    a third NMOS transistor having a fifth gate to which said differential voltage is inputted, a fifth source connected to said first source and said second source, and a fifth drain, and
    a third PMOS transistor having a sixth gate which is connected to said first drain of said first NMOS transistor and to which a mirror voltage generated in said first differential circuit is inputted, a sixth drain connected to said fifth drain, and a sixth source,
    said voltage being outputted from a connecting point of said fifth drain and said sixth drain,
    said first clamping circuit includes a first diode having an anode to which said voltage is inputted, and
    said second clamping circuit includes a second diode having an anode to which said differential voltage is inputted.

13. A circuit according to claim 12, wherein said first and second diodes are Zener diodes.

14. A circuit according to claim 6, wherein
    said first differential circuit includes
    a first NMOS transistor having a first gate to which said input signal is inputted, a first source, and a first drain,
    a second NMOS transistor having a second gate to which said reference signal is inputted, a second source connected to said first source, and a second drain,
    a first PMOS transistor having a third gate connected to said first drain, a third source, and a third drain connected to said first drain and said third gate, and
    a second PMOS transistor having a fourth gate connected to said third gate, a fourth source connected to said third source, and a fourth drain connected to said second drain,
    said differential voltage being outputted from a connecting point of said second drain and said fourth drain,
    said inverter circuit includes
    a third NMOS transistor having a fifth gate to which said differential voltage is inputted, a fifth source connected to said first source and said second source, and a fifth drain, and
    a third PMOS transistor having a sixth gate which is connected to said first drain of said first NMOS transistor and to which a mirror voltage generated in said first differential circuit is inputted, a sixth drain connected to said fifth drain, and a sixth source,
    said voltage being outputted from a connecting point of said fifth drain and said sixth drain,
    said first clamping circuit includes a first diode having an anode to which said differential voltage is inputted, and
    said second clamping circuit includes a second diode having an anode to which said voltage is inputted.

15. A circuit according to claim 14, wherein said first and second diodes are Zener diodes.

16. A circuit according to claim 6, wherein
    said first differential circuit includes:
    a first NMOS transistor having a first gate to which said reference signal is inputted, a first source, and a first drain,
    a second NMOS transistor having a second gate to which said input signal is inputted, a second source connected to said first source, and a second drain,
    a first PMOS transistor having a third gate connected to said first drain, a third source, and a third drain connected to said first drain and said third gate, and
    a second PMOS transistor having a fourth gate connected to said third gate, a fourth source connected to said third source, and a fourth drain connected to said second drain,
    said differential voltage being outputted from a connecting point of said second drain and said fourth drain,
    said inverter circuit includes
    a third NMOS transistor having a fifth gate to which said differential voltage is inputted, a fifth source connected to said first source and said second source, and a fifth drain, and a third PMOS transistor having a sixth gate which is connected to said first drain of said first NMOS transistor and to which a mirror voltage generated in said first differential circuit is inputted, a sixth drain connected to said fifth drain, and a sixth source, said voltage being outputted from a connecting point of said fifth drain and said sixth drain, said first clamping circuit includes a fourth NMOS transistor having a seventh gate to which said voltage is inputted, a seventh source, and a seventh drain connected to said seventh gate, and said second clamping circuit includes a fifth NMOS transistor having an eighth gate to which said differential voltage is inputted, an eighth source connected to said seventh source, and an eighth drain connected to said eighth gate.

17. A circuit according to claim 16, further comprising a sixth NMOS transistor having a ninth drain connected to said seventh source of said fourth NMOS transistor and said eighth source of said fifth NMOS transistor, a ninth gate to which said mirror voltage is inputted and a ninth source connected to the ground.

18. A circuit according to claim 6, wherein said first differential circuit includes a first NMOS transistor having a first gate to which said input signal is inputted, a first source, and a first drain, a second NMOS transistor having a second gate to which said reference signal is inputted, a second source connected to said first source, and a second drain, a first PMOS transistor having a third gate connected to said first drain, a third source, and a third drain connected to said first drain and said third gate, and a second PMOS transistor having a fourth gate connected to said third gate, a fourth source connected to said third source, and a fourth drain connected to said second drain, said differential voltage being outputted from a connecting point of said second drain and said fourth drain, said inverter circuit includes a third NMOS transistor having a fifth gate to which said differential voltage is inputted, a fifth source connected to said first source and said second source, and a fifth drain, and a third PMOS transistor having a sixth gate which is connected to said first drain of said first NMOS transistor and to which a mirror voltage generated in said first differential circuit is inputted, a sixth drain connected to said fifth drain, and a sixth source, said voltage being outputted from a connecting point of said fifth drain and said sixth drain, said first clamping circuit includes a fourth NMOS transistor having a seventh gate to which said differential voltage is inputted, a seventh source, and a seventh drain connected to said seventh gate, and said second clamping circuit includes a fifth NMOS transistor having an eighth gate to which said voltage is inputted, an eighth source connected to said seventh source, and an eighth drain connected to said eighth gate.

19. A circuit according to claim 18, further comprising a sixth NMOS transistor having a ninth drain connected to said seventh source of said fourth NMOS transistor and said eighth source of said fifth NMOS transistor, a ninth gate to which said mirror voltage is inputted, and a ninth source connected to the ground.

20. A circuit according to claim 6, wherein said first differential circuit comprises:

a first transistor to which an input signal is supplied;

a second transistor to which a reference signal is supplied;

a pair of transistors having a conductivity type different from that of said first and second transistors; and a transistor for current limitation which is serially connected to said first transistor and has the same conductivity type as that of said first transistor, and in which said reference signal is supplied to a gate.

21. A circuit according to claim 20, wherein in the case where each of said transistors is replaced to an equivalent circuit, a profile of the transistor is determined in a manner such that a magnitude of an equivalent resistance of the serial circuit of said first transistor and said transistor for current limitation is almost equal to a magnitude of an equivalent resistance of said second transistor.

22. A circuit according to claim 21, wherein a gate width of each of said first transistor and said transistor for current limitation is set to a width that is almost twice as large as a gate width of said second transistor.

23. A differential input circuit comprising:

a first differential circuit of a current mirror type for generating a first differential voltage by using an input voltage and a reference voltage;

a second differential circuit of a current mirror type for generating a second differential voltage having a phase opposite to that of said first differential voltage by using said input voltage and said reference voltage;

a third differential circuit for generating an output voltage corresponding to a difference voltage between said first differential voltage and said second differential voltage by using said first and second differential voltages;

a first clamping circuit, provided between said first differential circuit and said third differential circuit, for clamping said first differential voltage; and a second clamping circuit, provided between said second differential circuit and said third differential circuit, for clamping said second differential voltage, wherein each of said first and second clamping circuit comprises:

a first serial circuit which is formed by serially connecting a third transistor having a first conductivity type and a fourth transistor having a second conductivity type;

a second serial circuit which is formed by serially connecting a fifth transistor having the second conductivity type, a sixth transistor having the first conductivity type, a seventh transistor having the second conductivity type, and an eighth transistor having the first conductivity type;

first connecting means for supplying an electric potential at a connecting point of said sixth and seventh transistors to gate terminals of said fifth and eighth transistors;

second connecting means for supplying an electric potential at a connecting point of said fifth and sixth transistors to gate terminals of said third and sixth transistors; and third connecting means for supplying an electric potential at a connecting point of said seventh and eighth transistors to gate terminals of said fourth and seventh transistors, and a connecting point of said third and fourth transistors is connected to an input signal line of a logic gate circuit.

* * * * *